United States Patent
Tachibana et al.

(10) Patent No.: US 8,592,994 B2
(45) Date of Patent: Nov. 26, 2013

(54) SEMICONDUCTOR PACKAGE, CORE LAYER MATERIAL, BUILDUP LAYER MATERIAL, AND SEALING RESIN COMPOSITION

(75) Inventors: Kenya Tachibana, Tokyo (JP); Masahiro Wada, Tokyo (JP); Hitoshi Kawaguchi, Tokyo (JP); Kensuke Nakamura, Tokyo (JP)

(73) Assignee: Sumitomo Bakelite Co., Ltd., Tokyo (JP)

( * ) Notice: Subject to any disclaimer, the term of this patent is extended or adjusted under 35 U.S.C. 154(b) by 964 days.

(21) Appl. No.: 12/517,551

(22) PCT Filed: Dec. 5, 2007

(86) PCT No.: PCT/JP2007/073896
§ 371 (c)(1),
(2), (4) Date: Oct. 6, 2009

(87) PCT Pub. No.: WO2008/069343
PCT Pub. Date: Jun. 12, 2008

(65) Prior Publication Data
US 2010/0032826 A1 Feb. 11, 2010

(30) Foreign Application Priority Data
Dec. 5, 2006 (JP) ................................ 2006-328364

(51) Int. Cl.
*H01L 23/48* (2006.01)

(52) U.S. Cl.
USPC .................................. 257/778; 257/E23.068

(58) Field of Classification Search
USPC ......... 257/692, 778, 737, 772, 746, 780, 759, 257/747, 686, 787, 753, 783, 700, E23.068, 257/E21.503, E23.136, E23.021
See application file for complete search history.

(56) References Cited

U.S. PATENT DOCUMENTS

| | | | | |
|---|---|---|---|---|
| 6,512,182 B2 * | 1/2003 | Takeuchi et al. | ............... | 174/256 |
| 7,038,142 B2 * | 5/2006 | Abe | ............................. | 174/255 |

(Continued)

FOREIGN PATENT DOCUMENTS

| | | |
|---|---|---|
| CN | 1159461 | 9/1997 |
| JP | 2000-204131 | 7/2000 |

(Continued)

OTHER PUBLICATIONS

English translation of the Chinese Office Action for corresponding CN Application No. 2007800450571, May 27, 2010.

(Continued)

*Primary Examiner* — Evan Pert
*Assistant Examiner* — Selim Ahmed
(74) *Attorney, Agent, or Firm* — Ditthavong Mori & Steiner, P.C.

(57) ABSTRACT

A flip-chip semiconductor package includes a circuit board having a core layer and at least one buildup layer, a semiconductor device connected to the circuit board through a metal bump, and a cured member that is made of a sealing resin composition and enclosed between the semiconductor device and the circuit board. The coefficient of linear expansion at 25 to 75° C. of the cured member is 15 to 35 ppm/° C., the glass transition temperature of at least one buildup layer is 170° C. or more, and the coefficient of linear expansion of at 25 to 75° C. of the at least one buildup layer in the planar direction is 25 ppm or less. A highly reliable flip-chip semiconductor package, buildup layer material, core layer material, and sealing resin composition can be provided by preventing cracks and inhibiting delamination.

11 Claims, 1 Drawing Sheet

(56) References Cited

U.S. PATENT DOCUMENTS

| | | | |
|---|---|---|---|
| 7,741,160 B1* | 6/2010 | Wang et al. | 438/122 |
| 2005/0151270 A1* | 7/2005 | Jones | 257/783 |
| 2005/0266212 A1* | 12/2005 | Kanda et al. | 428/209 |
| 2006/0071337 A1* | 4/2006 | Shi et al. | 257/753 |
| 2007/0087479 A1* | 4/2007 | Lu et al. | 438/108 |

FOREIGN PATENT DOCUMENTS

| | | |
|---|---|---|
| JP | 2002-076201 | 3/2002 |
| JP | 2002-076202 | 3/2002 |
| JP | 2002-327035 | 11/2002 |
| JP | 2004-27005 | 1/2004 |
| JP | 2005-191243 | 7/2005 |
| JP | 2005-268259 | 9/2005 |
| JP | 2006-024842 | 1/2006 |
| JP | 2006-128712 | 5/2006 |
| JP | 2006-324642 | 11/2006 |
| WO | WO 2005/084948 | 9/2005 |
| WO | WO 2006/098219 | 9/2006 |

OTHER PUBLICATIONS

Chinese Office Action for corresponding CN Application No. 200780045057.1, Oct. 13, 2010.

Office Action issued by the Chinese Patent office on May 27, 2010.

Taiwanese Office Action for corresponding TW Application No. 096146255, Jan. 29, 2013.

* cited by examiner (a)

(b)

SEMICONDUCTOR PACKAGE, CORE LAYER MATERIAL, BUILDUP LAYER MATERIAL, AND SEALING RESIN COMPOSITION

TECHNICAL FIELD

The present invention relates generally to a semiconductor package and, more particularly, to a flip-chip semiconductor package.

BACKGROUND ART

Along with the functional progress and miniaturization of electronic devices in recent years, electronic parts have become highly integrated and are mounted at a high density. Semiconductor packages used in these electronic devices have become more and more miniaturized.

Packages using a lead frame of the type which has been generally used have a limitation to downsizing. For this reason, an area mounting-type package method in which chips are mounted on a circuit board (e.g., ball grid array (BGA) and chip scale package (CSP)) has been proposed. In such semiconductor packages, as a method for connecting a semiconductor chip to be mounted on a BGA package with a board, a wire bonding method, a tape automated bonding (TAB) method, a flip-chip (FC) method, and the like are known. In these days, many types of BGA and CSP structures using a flip-chip bonding method advantageous for miniaturization of a semiconductor package are proposed.

A semiconductor package having semiconductor chips mounted on a board has generally been used. As a board used for such semiconductor packages, a substrate having a core layer and a buildup layer has been used (for example, Patent Document 1).

Generally, the coefficient of linear expansion of the substrate (board) differs from that of the semiconductor chip. A substrate is formed from a material containing an organic resin and has a larger coefficient of linear expansion than that of a semiconductor chip. For this reason, if a semiconductor package of a structure having a semiconductor chip mounted on a substrate receives a heat history, the substrate warps due to the difference in coefficient of linear expansion between the substrate and the semiconductor chip. In common semiconductor packages, such warpage may cause cracks and peeling in semiconductor chips, at the interface between a semiconductor chip and a bump, at the interface between a bump and a substrate, and the like.

In addition to this problem, a substrate having a buildup layer which is abundantly used in recent years has a problem. As such a substrate, those having a buildup layer on a core layer have been used in general. Since the clock frequency of semiconductor chips is rapidly increasing, a substrate capable of reducing inductance is desired for mounting semiconductor chips. In a substrate having a core layer and a buildup layer, the inductance of the core layer through-holes is very large. In order to respond to the requirement for reducing the inductance, use of a substrate having a core layer as thin as possible has been proposed.

Generally, the core layer is provided in order to reduce the coefficient of linear expansion of the substrate. Therefore, when the core layer thickness is reduced, the coefficient of linear expansion of the substrate increases because the coefficient of linear expansion of a buildup layer is large. That is to say, there is a stronger tendency for producing cracks and peeling in semiconductor chips, at the interface of a semiconductor chip and a bump, at the interface of a bump and a substrate, and the like.

(Patent Document 1) Japanese Patent Application Laid-open No. 2005-191243

However, the combination of materials that have been used heretofore could not necessarily prevent cracks and peeling without fail.

DISCLOSURE OF THE INVENTION

The present invention has been achieved in order to solve the problems in general technologies and has an object of providing a highly reliable flip-chip semiconductor package, a core layer material, a buildup layer material, and a sealing resin composition which can suppress or reduce cracks and peeling without fail.

This object can be attained in the present invention by the following 1 to 15.

1. A flip-chip semiconductor package comprising a circuit board having a core layer and at least one buildup layer, a semiconductor chip connected to the circuit board through a metal bump, and a cured member that is made of a sealing resin composition and enclosed between the semiconductor chip and the circuit board, the cured member having a coefficient of linear expansion at 25 to 75° C. of 15 to 35 ppm/° C., and at least one buildup layer having a glass transition temperature of 170° C. or more and a coefficient of linear expansion at 25 to 75° C. in the planar direction of 25 ppm/° C. or less.
2. The flip-chip semiconductor package according to claim 1, wherein at least one buildup layer contains a fiber substrate.
3. The flip-chip semiconductor package according to claim 2, wherein the buildup layer containing the fiber substrate is an outermost buildup layer.
4. The flip-chip semiconductor package according to claim 2 or 3, wherein the fiber substrate has a thickness of 5 to 35 µm.
5. The flip-chip semiconductor package according to any one of claims 1 to 4, wherein the cured member has a glass transition temperature of 60 to 130° C.
6. The flip-chip semiconductor package according to any one of claims 1 to 5, wherein the sealing resin composition further contains at least one epoxy resin, a curing agent, a silane coupling agent, and an inorganic filler.
7. The flip-chip semiconductor package according to any one of claims 1 to 6, wherein the sealing resin composition has a viscosity of 50 Pa·sec or less at 25° C.
8. The flip-chip semiconductor package according to any one of claims 1 to 7, wherein the core layer has a glass transition temperature of 160 to 270° C. and a coefficient of linear expansion at 25 to 75° C. in the planar direction of 10 to 20 ppm/° C.
9. The flip-chip semiconductor package according to any one of claims 1 to 8, wherein the core layer has a thickness of 500 µm or less.
10. The flip-chip semiconductor package according to any one of claims 1 to 9, wherein the core layer is formed from a fiber substrate and a resin composition containing at least one of an epoxy resin, a phenol resin, a cyanate resin, a triazine resin, a bismaleimide resin, a polyimide resin, a polyamideimide resin, and a benzocyclobutene resin.
11. The flip-chip semiconductor package according to any one of claims 1 to 10, wherein the buildup layer is formed from a resin composition containing at least one of an epoxy resin, a phenol resin, a cyanate resin, a triazine resin, a bismaleimide resin, a polyimide resin, a polyamideimide resin, and a benzocyclobutene resin.

12. A core layer material used for the flip-chip semiconductor package according to any one of claims 1 to 11.
13. A buildup layer material used for the flip-chip semiconductor package according to any one of claims 1 to 11.
14. A sealing resin composition used for the flip-chip semiconductor package according to any one of claims 1 to 11.

According to the present invention, cracks and peeling due to stress concentration near the boundary interface of a semiconductor chip and a sealing resin composition can be surely suppressed or reduced by using the flip-chip semiconductor package comprising a circuit board having a core layer and a buildup layer, a semiconductor element connected to the circuit board through a metal bump, and a cured member made of a sealing resin composition enclosed between the semiconductor device and the circuit board, the cured member made of the sealing resin composition having a coefficient of linear expansion at 25 to 75° C. of 15 to 35 ppm/° C., and the buildup layer having a glass transition temperature of 170° C. or more and a coefficient of linear expansion at 25 to 75° C. in the planar direction of 25 ppm/° C. or less.

The flip-chip semiconductor package of the present invention has an effect of surely suppressing or reducing cracks and peeling, thus attaining high reliability.

BEST MODE FOR CARRYING OUT THE INVENTION

One embodiment of the flip-chip semiconductor package of the present invention is described below in detail with reference to the drawings.

<Structure of Semiconductor Package>

Figure 1:
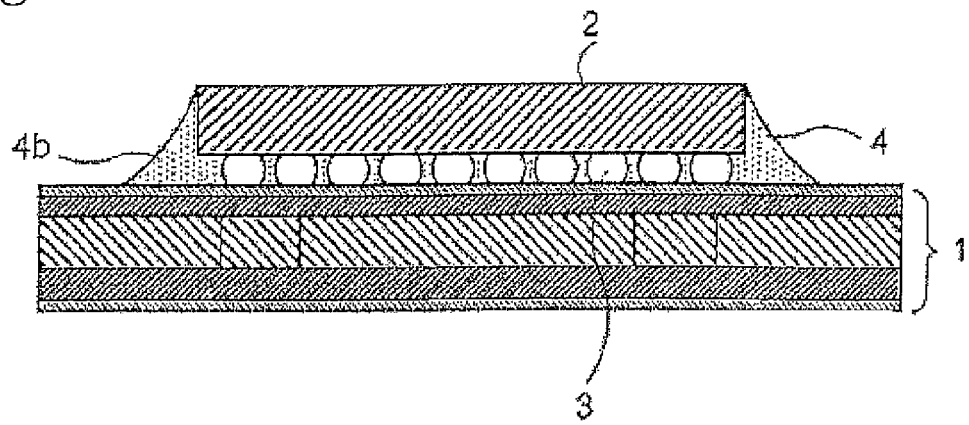
FIG. 1 is a schematic cross-section showing one example of the flip-chip semiconductor package of the present invention.

FIG. 1 is a schematic cross-sectional view showing a first embodiment of the flip-chip semiconductor package of the present invention, wherein a semiconductor chip 2 is arranged above a circuit board 1. The flip-chip semiconductor package has a thickness of 100 to 750 μm. The semiconductor chip bonding electrode surface on the top of the circuit board 1 is bonded to the electrode surface on the bottom of the semiconductor chip 2 by flip-chip bonding via solder balls 3. A sealing resin composition is injected and cured between the circuit board 1 and the semiconductor chip 2. Thus, the space between the circuit board 1 and the semiconductor chip 2 is sealed by the cured member 4.

<Sealing Resin Composition>

As the cured member 4 of the sealing resin composition shown in FIG. 1, those having (1) a coefficient of linear expansion at 25 to 75° C. of 15 to 35 ppm/° C., more preferably 20 to 35 ppm/° C. can be used. In addition, the cured member 4 of the sealing resin composition has (2) a glass transition temperature preferably of 60 to 130° C., and more preferably 70 to 115° C.

Such properties of the cured member 4 of the sealing resin composition can be adjusted by a person having an ordinary skill in the art without carrying out an undue experiment. The coefficient of linear expansion can be measured by the method according to JIS C6481 using, for example, a TMA (thermomechanical analyzer, manufactured by TA Instrument Co.) while heating at a rate of 10° C./min.

If the cured member 4 of the sealing resin composition having such properties is used, cracks and peeling due to the stress concentration near the boundary interface can be further effectively suppressed or reduced since the difference of the coefficient of linear expansion between the semiconductor chip 2 and the cured member 4 of the sealing resin composition can be maintained at a low level.

Since the coefficient of linear expansion of the cured member 4 of the sealing resin composition is large as compared with the coefficient of linear expansion of the circuit board 1 or the semiconductor chip 2, the component materials may produce warpage by environmental temperature variation and the like. This causes a stress concentration particularly near the boundary of the components. Such a stress concentration is liable to become a cause of a crack. The use of the cured member 4 of the sealing resin composition satisfying the above requirements for the glass transition temperature and the coefficient of linear expansion brings about the effect of reducing the thermal stress generated by the difference of the coefficient of linear expansion between the cured member 4 of the sealing resin composition, the circuit board 1 and the semiconductor chip 2.

A composition containing at least one epoxy resin, a curing agent, a silane coupling agent, and an organic filler can be used as the sealing resin composition for forming the cured member 4 in FIG. 1. Such a sealing resin composition preferably has excellent heat resistance and dielectric properties which contribute to promotion of reliability of the cured member 4. In addition, it is preferable to adjust the crosslinking density to reduce the glass transition temperature and elasticity of the cured member, so that the stress-reducing structure mentioned above may be ensured.

More specifically, the sealing resin composition used for forming the cured member 4 is a thermosetting resin composition, which is generally a liquid epoxy resin composition comprising (A) an epoxy resin, (B) a curing agent, (C) a silane coupling agent, and (D) an inorganic packing material or a filler. In addition to the above components (A) to (D), the sealing resin composition may further contain (E) other additives. These embodiments will now be described.

There are no specific limitations to the molecular weight and structure of the epoxy resin (A) contained in the sealing resin composition, insofar as the resin contains two or more epoxy groups in the molecule. For example, a novolac-type epoxy resin, a bisphenol-type epoxy resin, an aromatic glycidyl amine-type epoxy resin, a hydroquinone-type epoxy resin, a biphenyl-type epoxy resin, a stilbene-type epoxy resin, a triphenolmethane-type epoxy resin, a triphenolpropane-type epoxy resin, an alkyl-modified triphenolmethane-type epoxy resin, a triazine nucleus-containing epoxy resin, a dicyclopentadiene-modified phenol-type epoxy resin, a naphthol-type epoxy resin, a naphthalene-type epoxy resin, a phenolaralkyl-type epoxy resin, a naphtholaralkyl-type epoxy resin, and an aliphatic epoxy resin can be given.

An epoxy resin having a glycidyl ether structure or a glycidyl amine structure bonded to an aromatic ring is preferable from the viewpoint of heat resistance, mechanical characteristics, and moisture resistance. The amount of the aliphatic epoxy resin and the alicyclic epoxy resin is preferably limited when the reliability, particularly adhesion is considered. The above epoxy resins may be used either individually or in combination of two or more. Although the epoxy resin used for the curing member 4 is preferably liquid at an ordinary temperature (15 to 35° C.), an epoxy resin which is solid at the ordinary temperature (15 to 35° C.) may be used if such a resin can be dissolved in an epoxy resin which is liquid at an ordinary temperature (15 to 35° C.), and can form a liquid sealing resin composition.

There are no particular limitations to the molecular weight and structure of the curing agent (B) contained in the sealing resin composition, insofar as the curing agent contains one or more acid anhydride groups, or two or more functional groups other than the acid anhydride group which can form a covalent bond with the epoxy groups in the molecule. As specific examples of the functional group other than the acid anhydride groups, a phenolic hydroxyl group, a primary amine, a secondary amine, and the like can be given.

Either one curing agent may be used alone or two or more curing agents containing the same functional group may be used in combination. Alternatively, to the extent not affecting a pot life or curability with the epoxy resin, two or more curing agents, each containing a functional group differing from the other, may be used in combination. When considering the usage as a sealing material of a semiconductor package, a phenol resin curing agent and an aromatic polyamine curing agent are preferable from the viewpoint of heat resistant and electric mechanical properties. An aromatic polyamine curing agent is preferable because of the possession of both adhesiveness and moisture resistance.

The amount of the curing agent to be added is 0.6 to 1.4 active hydrogen equivalent, and preferably 0.7 to 1.3 active hydrogen equivalent, per one epoxy equivalent of the epoxy resin. If the active hydrogen equivalent of the curing agent is outside of the above range, the reactivity and heat resistance of the composition are unduly impaired. When the functional group contained in the curing agent is an acid anhydride group, one acid anhydride functional group is regarded to have two active hydrogen atoms in the above calculation since two carboxylic acid functional groups are derived from one acid anhydride functional group.

There are no specific limitations to the molecular weight and structure of the silane coupling agent (C) contained in the sealing resin composition, insofar as the silane coupling agent has a chemical structure containing a hydrocarbon moiety having a silicon atom and a functional group to which an alkoxyl group is bonded in one molecule. Examples of the silane coupling agent include epoxy silane coupling agents such as 3-glycidoxypropyltrimethoxysilane, 3-glycidoxypropyltriethoxysilane, 3-glycidoxypropylmethyldimethoxysilane, 3-glycidoxypropylethyldiethoxysilane, and 2-(3,4-epoxycyclohexyl)ethyltrimethoxysilane; silane coupling agents to which an acrylate group is bonded such as 3-methacryloxypropyltrimethoxysilane, 3-methacryloxypropyltriethoxysilane, 3-methacryloxypropylmethyldimethoxysilane, 3-methacryloxypropylethyldiethoxysilane, and 3-acryloxypropyltrimethoxysilane; aminosilane coupling agents such as N-amino ethylationaminopropylmethyldialkoxysilane, N-aminoethylationaminopropyltrialkoxysilane, 3-aminopropyltrimethoxysilane, 3-aminopropyltriethoxysilane, N-phenyl-γ-aminopropyltrimethoxysilane, N-phenyl-γ-aminopropyltriethoxysilane, N-phenyl-γ-aminobutyltrimethoxysilane, and N-phenyl-γ-aminobutyltriethoxysilane; and latent amino silane coupling agents protected by reacting a primary amino group of an aminosilane coupling agent such as N-(1,3-dimethylbutylidene)-3-(triethoxysilyl)propylamine and N-(benzylidene)-3-(triethoxysilyl)propylamine with a ketone or an aldehyde; mercaptosilane coupling agents such as 3-mercaptopropyltrimethoxysilane, 3-mercaptopropylmethyldimethoxysilane; silane coupling agents exhibiting the same effect as the mercaptosilanecoupling agent by thermally cracking, such as bis(3-triethoxysilylpropyl)tetrasulfide and bis(3-triethoxysilylpropyl)disulfide.

These silane coupling agents may also be added after hydrolyzing in advance. The above silane coupling agents may be used either individually or in combination of two or more. An epoxy silane coupling agent is preferable for use in the present invention due to comparatively good adhesion to circuit boards and the surface of the semiconductor package components (solder resist on the surface of a circuit board, polyimide on the surface of a silicon chip, the side of a silicon chip). Amino silane coupling agents, latent amino silane coupling agents, and mercapto silane coupling agents are preferable since these silane coupling agents exhibit excellent adhesion to polyimide on the surface of a silicon chip and a silicon-nitride surface.

As a method for adding the silane coupling agent, an integral blending method of adding, dispersing, and mixing the silane coupling agent when a silica filler is mixed with other materials in the course of manufacturing the resin composition, a master batch method of previously dispersing and dissolving the silane coupling agent in the epoxy resin (A), aromatic amine curing agent (B), and/or additives other than a silica filler and adding the resulting dispersant to the remaining materials, a method of previously causing the silane coupling agent to chemically modify the surface of a silica filler, and the like can be given. Any of these methods or a combination of these methods may be used. In order to obtain a homogeneous resin composition, the master batch method or a combination of the master batch method and the method of chemically modifying the silica surface is preferred.

As examples of the inorganic filler (D) used in the sealing resin composition, talc, sintered clay, non-sintered clay, mica, silicate such as glass, oxides such as titanium oxide, alumina, molten silica (molten spherical silica, molten crushed silica), and silica powder (synthetic silica, crystal silica), carbonates such as calcium carbonate, magnesium carbonate, and hydrotalcite, hydroxides such as aluminium hydroxide, magnesium hydroxide, and calcium hydroxide, sulfate or sulfite such as barium sulfate, calcium sulfate, and calcium sulfite, borates such as zinc borate, barium metaborate, aluminum borate, calcium borate, and sodium borate, and nitrides such as aluminium nitride, boron nitride, and silicon nitride can be given. These inorganic fillers may be used either alone or mixed. Among the above inorganic fillers, molten silica, crystal silica, and synthetic silica powder are preferable due to their capability of improving heat resistance, moisture resistance, and hardness of the resin composition.

Although there are no specific limitations to the form of the inorganic filler, spherical inorganic fillers are preferable from the viewpoint of filling properties. In this instance, the average diameter of the inorganic filler is preferably 0.1 to 20 μm, and particularly preferably 0.2 to 8 μm. The above range is preferable since the inorganic filler having an average diameter more than the above lower limit reduces the viscosity of the resin composition, and can thus improve the filling properties; if the average diameter is not more than the above upper limit, the resin composition clogs clearances of the semiconductor packages only with difficulty.

In addition to the above components, other additives (E) such as a low stress material, a diluent, a pigment, a flame retardant, a surfactant, a leveling agent, and a defoamer may be added to the sealing resin composition, as required.

The sealing resin composition of the present invention can be produced by dispersing and kneading the above components and additives using a planetary mixer, a three roll machine, a two-spindle hot roller, an automatic mortar, or the like, followed by defoaming under vacuum. In order to remove volatile components in the raw material, the mixture may be treated with heat, either previously or in the course of manufacturing, under atmospheric pressure or reduced pressure at a temperature not causing a reaction between the epoxy resin and the curing agent or decomposition of the components, for example, at 50 to 200° C. In addition, an aging treatment may be carried out in the course of, or in the final stage of, the dispersion and mixing process at a temperature of 5 to 35° C. for 12 to 96 hours.

The above sealing resin composition can produce a cured member having a coefficient of linear expansion at 25 to 75° C. of 15 to 35 ppm/° C., and preferably 20 and 35 ppm/° C., and a glass transition temperature of 60 to 130° C., and preferably 70 to 115° C., when the following conditions are satisfied. The composition comprises (A) an epoxy resin, (B) a curing agent, (C) a silane coupling agent, and (D) an inorganic filler. The epoxy resin (A) is a bisphenol epoxy resin such as a bisphenol A epoxy resin and a bisphenol F epoxy resin or an aromatic glycidyl amine epoxy resin such as N,N-diglycidyl aniline, N,N-diglycidyl toluidine, diamino diphenylmethane glycidyl amine, and aminophenol glycidyl amine which are liquid at ordinary temperature. The curing agent (B) is a novolac-type phenol resin such as a phenol novolac resin and a cresol novolac resin; an aliphatic polyamine such as diethylenetriamine, triethylenetetraamine, tetraethylenepentamine, m-xylenediamine, trimethylhexamethylenediamine, and 2-methylpentamethylenediamine; an alicyclic polyamine such as isophoronediamine, 1,3-bisaminomethyl cyclohexane, bis(4-aminocyclohexyl)methane, norbornene diamine, and 1,2-diaminocyclohexane; and an aromatic polyamine such as N-aminoethylpiperazine, diaminodiphenylmethane, m-phenylenediamine, diaminodiphenyl sulfone, diethyltoluenediamine, trimethylene bis(4-aminobenzoate), and polytetramethylene oxide di-p-aminobenzoate. The silane coupling agent (D) is an epoxy silane coupling agent such as 3-glycidoxypropyltrimethoxysilane, 3-glycidoxypropyltriethoxysilane, 3-glycidoxypropylmethyldimethoxysilane, 3-glycidoxypropylethyldiethoxysilane, and 2-(3,4-epoxycyclohexyl)ethyltrimethoxysilane, or an amino silane coupling agent such as N-aminoethylationaminopropylmethyldialkoxysilane, N-amino ethylationaminopropyltrialkoxysilane, 3-aminopropyltrimethoxysilane, 3-aminopropyltriethoxysilane, N-phenyl-γ-aminopropyltrimethoxysilane, N-phenyl-γ-aminopropyltriethoxysilane, N-phenyl-γ-aminobutyl trimethoxysilane, and N-phenyl-γ-aminobutyltriethoxysilane. The inorganic filler (D) is molten silica, crystal silica, or a synthetic silica powder preferably having a spherical form with an average particle diameter of 0.1 to 20 μm, and preferably 0.2 to 8 μm.

The above sealing resin composition can produce a cured member having a coefficient of linear expansion at 25 to 75° C. of 15 to 35 ppm/° C., and preferably 20 to 35 ppm/° C., and a glass transition temperature of 60 to 130° C., and preferably 70 to 115° C., when the following conditions are satisfied. The composition comprises (A) an epoxy resin, (B) a curing agent, (C) a silane coupling agent, and (D) an inorganic filler. The amount of the bisphenol epoxy resin (A) which is liquid at an ordinary temperature in the sealing resin composition is 30 to 100 wt %, and more preferably 50 to 100 wt %. The amount of the curing agent (B) is 0.6 to 1.4 active hydrogen equivalent, and preferably 0.7 to 1.3 active hydrogen equivalent, per one epoxy equivalent of the epoxy resin (A). The amount of the silane coupling agent (C) in the sealing resin composition is 0.5 to 5 wt %, and preferably 0.8 to 4 wt %. The amount of the inorganic filler (D) in the sealing resin composition is 50 to 75 wt %, and preferably 55 to 70 wt %.

If the amount of the components is in the above range, the composition has a satisfactory glass transition temperature, which is neither too high nor too low, and exhibits good curability, the amount of inorganic filler may be appropriately adjusted, and a product with a good coefficient of linear expansion can be obtained.

<Circuit Board>

FIG. 1 shows a circuit board 1 which is a multilayer circuit board having a core layer and at least one buildup layer. At least one buildup layer has a glass transition temperature of 170° C. or more and a coefficient of linear expansion in the planer direction between 25° C. and 75° C. of 25 ppm/° C. or less. The circuit board may have two or more buildup layers. The coefficient of linear expansion in the planer direction between 25° C. and 75° C. can be measured by the method according to JIS C6481 using, for example, a TMA (manufactured by TA Instrument Co.) while heating at a rate of 10° C./min.

If the glass transition temperature of the buildup layer is less than 170° C., warping of the circuit board is large when cooled to the room temperature after heating during fabrication. One factor for controlling warping of the multilayer circuit board is a coefficient of linear expansion at a temperature equivalent to or less than the glass transition temperature. The glass transition temperature of the buildup layer is preferably 175° C. or more.

The coefficient of linear expansion of the buildup layer in the planer direction between 25° C. and 75° C. of higher than 25 ppm/° C. is more than twice the coefficient of linear expansion of copper (17 to 18 ppm/° C.) which is usually used in a circuit board and becomes a major cause of enlarging warping of the board. A preferable coefficient of linear expansion in the planer direction between 25° C. and 75° C. is 5 to 20 ppm/° C., with a range of 5 to 15 ppm/° C. being more preferable.

The modulus of elasticity of the buildup layer at 25° C. is preferably 5 GPa or more. The circuit board has high rigidity as a whole and exhibits excellent processability and properties easy to handle in fabrication of semiconductor packages particularly when the circuit is thin (0.5 mm or less).

When the circuit board is a multilayer circuit board having two or more buildup layers, (i) any one layer or two or more layers are buildup layers having a glass transition temperature and a coefficient of linear expansion at 25 to 75° C. in the planar direction in the above-mentioned ranges, preferably also having a modulus of elasticity in the above-mentioned range, (ii) it is preferable that either one of the upper outermost layer and the lower outermost layer is a buildup layer having a glass transition temperature and a coefficient of linear expansion at 25 to 75° C. in the planar direction in the above-mentioned ranges, preferably also having a modulus of elasticity in the above-mentioned range, (iii) it is particularly preferable that both of the upper outermost layer and the lower outermost layer are buildup layers having a glass transition temperature and a coefficient of linear expansion at 25 to 75° C. in the planar direction in the above-mentioned ranges, preferably also having a modulus of elasticity in the above-mentioned range, and (iv) it is more preferable that all of the layers are buildup layers having a glass transition temperature and a coefficient of linear expansion at 25 to 75° C. in the planar direction in the above-mentioned ranges, preferably also having a modulus of elasticity in the above-mentioned range. For example, in a circuit board consisting of one core layer and eight buildup layers, in which four buildup layers are formed on the core layer and four buildup layers are formed below the core layer, in the order of the four buildup layers, the core layer, and the other four buildup layers, it is preferable that (i) any one of the buildup layers or two or more of them be the buildup layers having the above-mentioned properties, or (ii) either the upper outermost layer or the lower outermost layer be the buildup layer having the above-mentioned properties, and it is particularly preferable that (iii) both the upper outermost layer and the lower outermost layer be the buildup layer having the above-mentioned properties, and it is more preferable that (iv) all of the buildup layers be the buildup layers having the above-mentioned properties.

The thickness of a buildup layer is 10 to 60 μm, and preferably 20 to 50 μm.

The buildup layer having a glass transition temperature and a coefficient of linear expansion at 25 to 75° C. in the planar direction in the above-mentioned ranges, preferably also having a modulus of elasticity in the above-mentioned range, preferably contains a fiber substrate.

The buildup layer that contains a fiber substrate therein is preferable. It is preferable that the multilayer buildup layer has at least one buildup layer which contains a fiber substrate. The buildup layer containing a fiber substrate possesses excellent mechanical properties such as modulus of elasticity. In the case of a multilayer circuit board having two or more buildup layers, among the buildup layers, (i) it is preferable that any one of the layers or two or more layers contain a fiber substrate, (ii) it is particularly preferable that either the upper outermost layer or the lower outermost layer contain a fiber substrate, (iii) it is more preferable that both the upper outermost layer and the lower outermost layer contain a fiber substrate, and (iv) it is still more preferable that all of the layers contain a fiber substrate. For example, in a circuit board consisting of one core layer and four buildup layers both above and below the core layer, in the order of, from the top, the four buildup layers, the core layer, and the other four buildup layers, (i) it is preferable that any one of the buildup layers or two or more of these contain a fiber substrate, (ii) it is particularly preferable that either the upper outermost layer or the lower outermost layer contain a fiber substrate, (iii) it is more preferable that both the upper outermost layer and the lower outermost layer contain a fiber substrate, and (iv) it is still more preferable that all of the buildup layers contain a fiber substrate.

It is preferable that the core layer have a glass transition temperature of 160 to 270° C., a coefficient of linear expansion in the planer direction between 25° C. and 75° C. of 10 to 20 ppm/° C., and a thickness of 500 μm or less, more preferably 50 to 400 μm, and still more preferably 100 to 300 μm.

The multilayer circuit board consists of one core layer and, for example, 2 to 10 buildup layers. Preferably, the multilayer circuit board consists of one core layer and 2 to 6 buildup layers.

The surface of the outer layer of the circuit board may be provided with a heat resistant coating layer such as a solder resist with an object of protecting the conductor and maintaining insulating properties.

Such properties of the circuit board 1 can be adjusted by a person having an ordinary skill in the art without carrying out an undue experiment. If the circuit board 1 having such properties is used, cracks due to the stress concentration can be more excellently suppressed or reduced, in addition to the effect brought about by the adjustment of properties of the cured member 4 of the sealing resin composition, since the difference of the coefficient of linear expansion between the circuit board 1 and the cured member 4 can be maintained small.

In FIG. 1, the horizontal direction is the planner direction and the vertical direction is the thickness direction.

<Core Layer>

It is sufficient for the circuit board 1 that the core layer have an appropriate hardness in addition to the above-mentioned requirements of glass transition temperature and coefficient of linear expansion. The core layer is preferably a cured product of a thermosetting resin composition containing a thermosetting resin, and particularly preferably a cured product of a thermosetting resin composition containing a thermosetting resin and a fiber substrate.

The core layer can be obtained by curing the core layer forming material. Although not particularly limited, as the core layer forming material, a plate-like material (prepreg) obtained by impregnating a fiber substrate (such as a glass fiber sheet) with a thermosetting resin composition which contains at least one of the thermosetting resins or two or more thermosetting resins selected from the group consisting of an epoxy resin, a phenol resin, a cyanate resin, a triazine resin, a bismaleimide resin, a polyimide resin, a polyamide-imide resin, and a benzocyclobutene resin, and by half-curing the resins is preferably used. The plate-like material (prepreg) obtained by impregnating a fiber substrate (such as a glass fiber sheet) with a thermosetting resin composition containing a cyanate resin, a phenol resin, an epoxy resin, and an inorganic filler, and half-curing the resin is particularly preferably used. The core layer can be formed by curing the prepreg with heat.

Use of a cyanate resin (including prepolymer of cyanate resin) as the thermosetting resin for the core layer is preferable because the coefficient of linear expansion of the prepreg cured product, i.e. the core layer, can be reduced and a prepreg cured product, i.e. core layer, having electrical properties (low dielectric constant, low dielectric loss tangent) and superior mechanical hardness can be obtained. The term "prepolymer" indicates a compound produced by partial polymerization of an isocyanate resin.

The isocyanate resin can be obtained by, for example, reacting a halogenated cyanide compound and a phenol compound and prepolymerizing the resulting reaction product by heating, as required. Specific examples include novolac-type cyanate resins and bisphenol-type cyanate resins such as a bisphenol A-type cyanate resin, a bisphenol E-type cyanate resin, and a tetramethyl bisphenol F-type cyanate resin. Of these, novolac-type cyanate resins are preferable. Use of the novolac-type cyanate resins can promote heat resistance due to an increase in crosslinking density and improve flame retardancy of the resin composite and the like, since the novolac-type cyanate resins form a triazine ring after the curing reaction. Furthermore, it is thought that the novolac-type cyanate resins are easily carbonized due to the high proportion of a benzene ring in their structure. Even in the case of reducing the thickness of prepreg to 0.5 mm or less, the circuit board obtained by curing the prepreg can be provided with excellent rigidity. Since the novolac-type cyanate resins have excellent rigidity particularly during heating, the novolac-type cyanate resins exhibit excellent reliability during mounting of semiconductor chips.

As the above novolac-type cyanate resin, a compound of the following formula (1), for example, can be used.

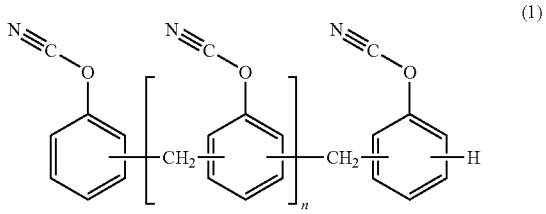

(1)

Although there are no particular limitations, the average number of repeating units n in the novolak-type cyanate resin of the above formula is preferably 1 to 10, and particularly preferably 2 to 7. The novolac-type cyanate resin having the average number of repeating units n of less than the above lower limit has a reduced heat resistance and may dissociate and vaporize a low molecular compound when heated. If the average number of repeating units n is larger than the above upper limit, the melt viscosity of the resin becomes too high and formability of prepregs may be impaired.

Although there are no particular limitations, the weight average molecular weight of the cyanate resin is preferably 500 to 4500, and particularly preferably 600 to 3000. If the weight average molecular weight is less than the above lower limit, the prepreg produced from the cyanate resin has tackiness. The prepregs may adhere to each other when brought into contact or transcription of the resin may occur. If the weight average molecular weight is more than the above upper limit, the reaction may proceed too fast. If a circuit board is fabricated using such a resin, mal-forming may occur and the interlayer peel strength may become reduced.

The weight average molecular weight of the cyanate resin can be measured by GPC (Gel Permeation Chromatography, reduced to reference material polystyrene).

Although not particularly limited, one type of the above-mentioned cyanate resin may be used alone, two or more types of the cyanate resins, each having a molecular weight differing from the other, may be used in combination, or one type or two or more types of the cyanate resins and prepolymers of these cyanate resins may be used in combination.

Although there are no particular limitations to the amount of the above-mentioned thermosetting resins, an amount of 5 to 50 wt %, particularly 20 to 40 wt %, of the total amount of the resin composition is preferable. If the amount of the thermosetting resins is less than the above lower limit, there may be a case in which it is difficult to form a prepreg. If more than the above upper limit, the prepreg hardness may be reduced.

The above resin composition preferably contains an inorganic filler. The inorganic filler can increase hardness even if a thin circuit board is fabricated (thickness: 0.5 mm or less). The inorganic filler can also reduce the linear expansion of the circuit board.

As examples of the inorganic filler, talc, sintered clay, non-sintered clay, mica, silicate such as glass, oxides such as titanium oxide, alumina, silica, and molten silica, carbonates such as calcium carbonate, magnesium carbonate, and hydrotalcite, hydroxides such as aluminium hydroxide, magnesium hydroxide, and calcium hydroxide, sulfates or sulfites such as barium sulfate, calcium sulfate, and calcium sulfite, borates such as zinc borate, barium metaborate, aluminum borate, calcium borate, and sodium borate, nitrides such as aluminium nitride, boron nitride, silicon nitride, and carbon nitride, and titanates such as strontium titanate and barium titanate can be given. These inorganic fillers may be used either individually or in combination of two or more. Of these, silica is preferable, with molten silica (especially spherical molten silica) being particularly preferable due to the excellent capability of reducing the linear expansion. The silica may have a crushed form or a spherical form. The forms are selected according to the purpose of use. For example, the spherical silica is used to reduce the melt viscosity of the resin composition in order to ensure impregnation in a fiber substrate.

When a cyanate resin (particularly a novolac-type cyanate resin) is used as the thermosetting resin for the core layer, it is preferable to use a cyanate resin and either an epoxy resin (substantially free from a halogen atom) or a phenol resin, or both the epoxy resin and the phenol resin.

As examples of the epoxy resin which can be used in combination with the cyanate resin, bisphenol-type epoxy resins such as a bisphenol A-type epoxy resin, a bisphenol F-type epoxy resin, a bisphenol E-type epoxy resin, a bisphenol S-type epoxy resin, a bisphenol M-type epoxy resin, a bisphenol P-type epoxy resin, and a bisphenol Z-type epoxy resin; novolac-type epoxy resins such as a phenol novolac-type epoxy resin and a cresol novolac-type epoxy resin; arylalkylene-type epoxy resins such as a biphenyl-type epoxy resin, xylylene-type epoxy resin, and a biphenyl aralkyl-type epoxy resin; a naphthalene-type epoxy resin, an anthracene-type epoxy resin, a phenoxy-type epoxy resin, a dicyclopentadiene-type epoxy resin, a norbornene-type epoxy resin, an adamantane-type epoxy resin, and a fluorene-type epoxy resin can be given.

One type of the above-mentioned epoxy resins may be used alone, two or more types of the epoxy resins, each having a molecular weight differing from the other, may be used in combination, or one type or two or more types of the epoxy resins and prepolymers of these epoxy resins may be used in combination.

Of these epoxy resins, arylalkylene-type epoxy resins are particularly preferable. The arylalkylene epoxy resins can promote moisture-absorption solder heat resistance and flame retardancy.

The term "arylalkylene-type epoxy resin" refers to an epoxy resin containing one or more arylalkylene groups in the repeating units. For example, a xylylene-type epoxy resin, a biphenyl dimethylene-type epoxy resin, and the like can be given. Of these, the biphenyl dimethylene-type epoxy resin is preferable. As the biphenyl dimethylene-type epoxy resin, the compound of the following formula (2) can be given, for example.

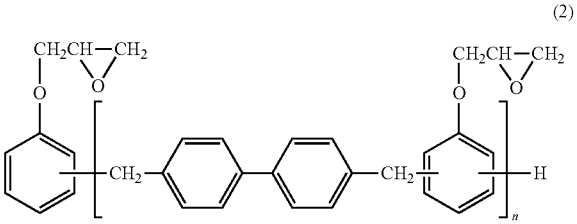

(2)

Although there are no particular limitations, the average number of repeating units n of the biphenyl dimethylene type epoxy resin shown by the above formula (2) is preferably 1 to 10, and particularly preferably 2 to 5. The biphenyl dimethylene-type epoxy resin having the average number of repeating units n of less than the above lower limit may be handled with difficulty since such the resin is easily crystallized and has comparatively low solubility in commonly used solvents.

If the average number of repeating units n is larger than the above upper limit, the flowability of the resin is reduced, which may impair formability.

Although there are no particular limitations to the amount of the epoxy resins, an amount of 1 to 55 wt %, particularly 2 to 40 wt %, of the total amount of the resin composition is preferable. If the amount of the epoxy resins is less than the above lower limit, there may be a case in which the cyanate resin exhibits reduced reactivity or the resulting product has a low moisture resistance. If more than the above upper limit, the heat resistance may be reduced.

Although there are no particular limitations, the weight average molecular weight of the epoxy resin is preferably 500 to 20,000, and particularly preferably 800 to 15,000. If the weight average molecular weight is less than the above lower limit, there may be a case in which the prepreg has tackiness. If more than the above upper limit, the fiber substrate may be impregnated with the resin composition only with difficulty when preparing a prepreg. A uniform product may not be obtained in some cases.

The weight average molecular weight of the epoxy resin can be measured by GPC, for example.

As the phenol resin used in combination with the cyanate resin, for example, a novolac-type phenol resin, a resol-type phenol resin, and an arylalkylene-type phenol resin can be given. One type of the above-mentioned phenol resins may be used alone, two or more types of the phenol resins, each having a molecular weight differing from the other, may be used in combination, or one type or two or more types of the phenol resins and prepolymers of these phenol resins may be used in combination. Of these, the arylalkylene-type phenol resin is preferable. The moisture absorption solder heat resistance further be can improved by using the arylalkylene phenol resin.

As examples of the arylalkylene-type phenol resin, a xylylene-type phenol resin, a biphenyl dimethylene-type phenol resin, and the like can be given. As the biphenyl dimethylene-type phenol resin, the compound of the following formula (3) can be given, for example.

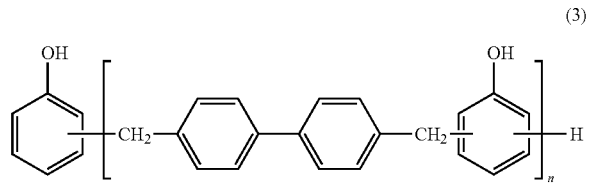

(3)

Although there are no particular limitations, the number of repeating units n of the biphenyl dimethylene-type phenol resin shown by the above formula (3) is preferably 1 to 12, and particularly preferably 2 to 8. If the average number of repeating units n is less than the above lower limit, the heat resistance may be lowered. If more than the above upper limit, compatibility with the other resins may become poor and workability may be impaired.

The crosslinking density can be controlled and the reactivity can be easily controlled by the combination of the above-mentioned cyanate resin (especially novolac-type cyanate resin) and the arylalkylene-type phenol resin.

Although there are no particular limitations to the amount of the phenol resins, an amount of 1 to 55 wt %, particularly 5 to 40 wt %, of the total amount of the resin composition is preferable. If the content is less than the above lower limit, heat resistance may be poor. If more than the above upper limit, the characteristics of low coefficient of linear expansion may be impaired.

Although there are no particular limitations, the weight average molecular weight of the phenol resin is preferably 400 to 18,000, and particularly preferably 500 to 15,000. If the weight average molecular weight is less than the above lower limit, there may be a case in which the prepreg has tackiness. If more than the above upper limit, the fiber substrate may be impregnated with the resin composition only with difficulty when preparing the prepreg. A uniform product may not be obtained in some cases.

The weight average molecular weight of the phenol resin can be measured by GPC, for example.

A circuit board having particularly excellent dimension stability can be fabricated by using a combination of the above-mentioned cyanate resin (especially the novolac-type cyanate resin), the above-mentioned phenol resin (arylalkylene-type phenol resin, especially the biphenyl dimethylene-type phenol resin), and the above-mentioned epoxy resin (arylalkylene-type epoxy resin, especially the biphenyl dimethylene-type epoxy resin).

Although not particularly limited, a coupling agent is preferably used in the thermosetting resin composition for the above-mentioned core layer. The coupling agent can uniformly settle the thermosetting resin and the like and inorganic filler in the fiber substrate by promoting wettability of the interface between the thermosetting resin and the inorganic filler, whereby heat resistance, particularly the solder heat resistance after moisture absorption can be improved.

Any commonly-used coupling agent can be used as the above-mentioned coupling agent. Specifically, it is desirable to use one or more coupling agents selected from the group consisting of an epoxy silane coupling agent, a cationic silane coupling agent, an aminosilane coupling agent, a titanate coupling agent, and a silicone oil coupling agent. Use of these coupling agents can increase wettability in the interface of the inorganic fillers, whereby heat resistance can be promoted.

Although there are no particular limitations to the amount of the coupling agent, which varies according to the specific surface area of the inorganic filler, an amount of 0.05 to 3 parts by weight, particularly 0.1 to 2 parts by weight, for 100 parts by weight of the inorganic filler is preferable. If the amount of the coupling agent is less than the above lower limit, the effect of increasing the heat resistance may be impaired due to insufficient covering of the inorganic filler. If more than the above upper limit, the reactivity is affected, which may lead to impaired bending strength and the like.

A curing promoter may be used, as required, in the thermosetting resin composition for the above-mentioned core layer. As the curing promoter, commonly known curing promoters can be used. Examples include organic metal salts such as zinc naphthenate, cobalt naphthenate, stannous octoate, cobalt octoate, bisacetylacetonato cobalt (II), and trisacetylacetonato cobalt (III); tertiary amines such as triethylamine, tributylamine, and diazabicyclo[2,2,2]octane; imidazoles such as 2-phenyl-4-methylimidazole, 2-ethyl-4-ethylimidazole, 2-phenyl-4-methylimidazole, 2-phenyl-4-methyl-5-hydroxyimidazole, and 2-phenyl-4,5-dihydroxyimidazole; phenolic compounds such as phenol, bisphenol A, and nonylphenol; and organic acids such as acetic acid, benzoic acid, salicylic acid, and paratoluenesulfonic acid. Mixtures of these compounds may also be used. These compounds, as well as derivatives of these compounds, may be used as the curing promoter either individually or in combination of two or more.

Although there are no particular limitations to the amount of the above-mentioned curing promoters, an amount of 0.05 to 5 wt %, particularly 0.2 to 2 wt %, of the total amount of the resin composition is preferable. If the amount of the curing promoter is less than the above lower limit, there may be a case in which the effect of curing promotion is not exhibited. If more than the above upper limit, the prepreg storage stability may be reduced.

Thermoplastic resins such as a phenoxy resin, a polyimide resin, a polyamideimide resin, a polyphenylene oxide resin, a polyether sulfone resin, a polyester resin, a polyethylene resin, and a polystyrene resin; polystyrene thermoplastic elastomers such as a styrene butadiene copolymer and a styrene isoprene copolymer, thermoplastic elastomers such as a polyolefin thermoplastic elastomer, a polyamide elastomer, and a polyester elastomer; and diene elastomers such as polybutadiene, epoxy-modified polybutadiene, acryl-modified polybutadiene, and methacryl-modified polybutadiene may also be used in the thermosetting resin composition for the above-mentioned core layer in combination with the thermosetting resins.

In addition to the above components, additives such as a pigment, a dye, a defoamer, a leveling agent, a UV absorber, a foaming agent, an antioxidant, a flame retardant, and an ion capture agent may be added, as required, to the thermosetting resin composition for the above-mentioned core layer.

The plate-like material (prepreg) obtained by impregnating a fiber substrate (such as a glass fiber sheet) with the thermosetting resin composition for the core layer and half-curing the resin is preferably used for fabricating circuit boards having excellent characteristics such as dielectric properties, and mechanical and electrical bonding reliability under high temperature and high humidity conditions.

As the above-mentioned fiber substrate, glass fiber substrates such as a woven glass fabric and a nonwoven glass fabric; polyamide resin fibers such as a polyamide resin fiber, an aromatic polyamide resin fiber, and an all aromatic polyamide resin fiber; polyester resin fibers such as a polyester resin fiber, an aromatic polyester resin fiber, and an all aromatic polyester resin fiber, synthetic fiber substrates consisting of woven or nonwoven fabrics containing a polyimide resin fiber, a fluororesin fiber, and the like as the major components; organic fiber substrates containing a paper substrate such as a kraft paper, a cotton-linter paper, a mixed paper of cotton linter and kraft pulp, and the like as the major components can be given. Of these, glass fiber substrate is preferable. The glass fiber substrate can increase the hardness and moisture absorption, and reduce the coefficient of linear expansion of the prepreg cured product which is the core layer.

As the method for impregnating the fiber substrate with the thermosetting resin composition for the core layer, a method of preparing a resin varnish using the resin composition and immersing the fiber substrate in the varnish, a method of coating the fiber substrate with the resin varnish using various coaters, a method of spraying the resin varnish onto the fiber substrate, and the like can be given. Of these, the method of immersing the fiber substrate in the varnish is preferable. Immersion of the fiber substrate in the varnish can improve impregnation of the resin composition in the fiber substrate.

When immersing the fiber substrate in the resin varnish, a general impregnation-coating apparatus may be used.

A solvent in which the resin in the resin composition exhibits good solubility is preferably used for preparing the resin varnish, but a poor solvent may be used to the extent that the solvent exhibits no adverse effect. As examples of the solvent in which the resin has good solubility, acetone, methyl ethyl ketone, methyl isobutyl ketone, cyclohexanone, tetrahydrofuran, dimethyl formamide, dimethyl acetamide, dimethyl sulfoxide, ethylene glycol, cellosolve, carbitol, and the like can be given.

Although there are no particular limitations to the amount of solid components in the above resin varnish, an amount of 40 to 80 wt %, particularly 50 to 65 wt %, of the total amount of the resin composition is preferable. The content of the solid components in this range further improves impregnation of the resin varnish in the substrate. The prepreg can be obtained by impregnating the fiber substrate with the resin composition and drying the substrate at a prescribed temperature in a range, for example, between 80 and 200° C.

By using the prepreg containing the fiber substrate and the above-mentioned cyanate resin as the thermosetting resin, particularly preferably the prepreg containing the fiber substrate and the above-mentioned cyanate resin and the above-mentioned epoxy resin or phenol resin as the thermosetting resin, and more preferably the prepreg containing the fiber substrate and the above-mentioned cyanate resin, epoxy resin, and phenol resin as the thermosetting resin, it is possible to make a core layer having a glass transition temperature of 160 to 270° C. and a coefficient of linear expansion in the planer direction between 25° C. and 75° C. of 10 to 20 ppm/° C.

In addition, by using the prepreg containing the fiber substrate and the thermosetting resin composition which contains the cyanate resin in an amount of 5 to 55 wt %, preferably 20 to 50 wt %, the chosen epoxy resin used in combination with the cyanate resin in an amount of 1 to 55 wt %, preferably 2 to 40 wt %, and the chosen phenol resin used in combination with the cyanate resin in an amount of 1 to 55 wt %, preferably 5 to 40 wt %, it is possible to make the core layer having a glass transition temperature of 160 to 270° C., a coefficient of linear expansion in the planer direction between 25° C. and 75° C. of 10 to 20 ppm/° C.

<Buildup Layer>

It is sufficient for the circuit board 1 mentioned above that the buildup layer have an appropriate hardness in addition to the above-mentioned requirements of the glass transition temperature and coefficient of linear expansion.

The buildup layer is preferably a cured product of a thermosetting resin composition containing a thermosetting resin, and particularly preferably a cured product of a thermosetting resin composition containing a thermosetting resin and a fiber substrate. Use of these materials can promote the heat resistance of the buildup layer.

The buildup layer is obtained by, for example, curing a buildup layer forming material. Although not particularly limited, the buildup layer forming material is preferably made from a thermosetting resin composition containing a thermosetting resin, and particularly preferably a thermosetting resin and a fiber substrate. Use of such a thermosetting resin composition can promote the heat resistance of the buildup layer.

The thermosetting resin composition for forming the buildup layer may be cured after the fiber substrate has been impregnated therewith or may be cured as is. There are no specific limitations to the method of impregnating the fiber substrate with the thermosetting resin composition. A buildup layer with a carrier substrate is made from a carrier substrate and a resin layer of the above thermosetting resin composition which is formed on the carrier substrate.

As examples of the thermosetting resin for forming the buildup layer, an epoxy resin, a phenol resin, a cyanate resin, a triazine resin, a bismaleimide resin, a polyimide resin, a polyamideimide resin, a benzocyclobutene resin, a resin which has a benzoxazine ring, a urea resin, resin which has a triazine ring such as a melamine resin, an unsaturated polyester resin, a polyurethane resin, a diallyl phthalate resin, and a silicone resin can be given.

One type of the above-mentioned thermosetting resins may be used alone, two or more types of the thermosetting resins, each having a molecular weight differing from the other, may be used in combination, or one type or two or more types of the thermosetting resins and prepolymers of these thermosetting resins may be used in combination.

The thermosetting resin composition preferably contains one or more resins selected from the group consisting of an epoxy resin, a phenol resin, a cyanate resin, a triazine resin, a bismaleimide resin, a polyimide resin, a polyamideimide resin, a benzocyclobutene resin, and a resin having a bezoxazine ring.

As examples of the epoxy resin, bisphenol-type epoxy resins such as a bisphenol A epoxy resin, a bisphenol F epoxy resin, a bisphenol E-type epoxy resin, a bisphenol S-type epoxy resin, a bisphenol Z-type epoxy resin, a bisphenol P-type epoxy resin, and a bisphenol M-type epoxy resin; novolac epoxy resins such as a phenol novolac-type epoxy resin and a cresol novolac epoxy resin; a biphenyl-type epoxy resin, a biphenyl aralkyl-type epoxy resin, an arylalkylene-type epoxy resin, a naphthalene-type epoxy resin, an anthracene-type epoxy resin, a phenoxy-type epoxy resin, a dicyclopentadiene-type epoxy resin, a norbornene-type epoxy resin, an adamantane-type epoxy resin, and a fluorene-type epoxy resin can be given.

Examples of the phenol resin include novolac-type phenol resins such as a phenol novolac resin, a cresol novolac resin, and a bisphenol A novolac resin; resol-type phenol resins such as an unmodified resol-type phenol resin and oil-modified resol phenol resins modified by oil such as tung oil, linseed oil, and walnut oil; and the like.

Of these, the cyanate resin (including a prepolymer of the cyanate resin) is particularly preferable. Use of the cyanate resin not only reduces the coefficient of linear expansion of the buildup layer, but also promotes the electrical properties (low dielectric constant, low dielectric loss tangent), the mechanical strength, and the like.

The cyanate resin can be obtained by, for example, reacting a halogenated cyanide compound and a phenol compound and prepolymerizing the resulting reaction product by heating, as required. Specific examples include novolac-type cyanate resins and bisphenol-type cyanate resins such as a bisphenol A-type cyanate resin, a bisphenol E-type cyanate resin, and a tetramethyl bisphenol F-type cyanate resin. Of these, novolac-type cyanate resins are preferable. Use of the novolac-type cyanate resins can promote heat resistance due to an increase of crosslinking density and improve flame retardancy of the resin composite and the like, since the novolac-type cyanate resins form a triazine ring after curing reaction. Furthermore, it is thought that the novolac-type cyanate resins are easily carbonized due to the high proportion of a benzene ring in their structure.

As the above novolac-type cyanate resin, the compound of the following formula (1), for example, can be used.

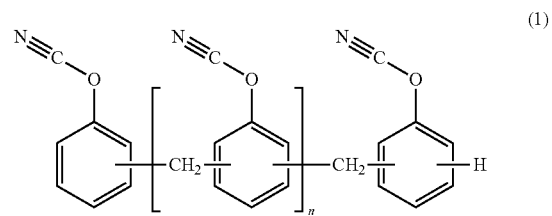

Although there are no particular limitations, the average number of repeating units n of the novolak type cyanate resin shown by the above formula (1) is preferably 1 to 10, and particularly preferably 2 to 7. The novolac-type cyanate resin having the average number of repeating units n of less than the above lower limit may be handled with difficulty since such a resin is easily crystallized and has a comparatively low solubility in commonly used solvents. If the average number of the repeating units n is larger than the above upper limit, the melt viscosity of the resin becomes too high and formability of the buildup layer may be impaired.

Although there are no particular limitations, the weight average molecular weight of the cyanate resin is preferably 500 to 4500, and particularly preferably 600 to 3000. If the weight average molecular weight is less than the above lower limit, the cured buildup layer may have reduced mechanical strength. Moreover, the buildup layers may have tackiness when prepared, and adhere to each other or transcription of the resin may occur. If the weight average molecular weight is more than the above upper limit, the curing reaction may proceed too fast. If a substrate (particularly a circuit board) is fabricated using such a resin, mal-forming may occur and interlayer peel strength may become reduced.

The weight average molecular weight of the cyanate resin can be measured by GPC (Gel Permeation Chromatography, reduced to reference material polystyrene).

Although not particularly limited, one type of the above-mentioned cyanate resin may be used alone, two or more types of the cyanate resins (including the derivative), each having a molecular weight differing from the other, may be used in combination, or one type or two or more types of the cyanate resins and prepolymers of these cyanate resins may be used in combination.

Although there are no particular limitations to the amount of the above-mentioned thermosetting resins for the buildup layer, an amount of 5 to 50 wt %, particularly 10 to 40 wt %, of the total amount of the resin composition is preferable. If the amount of the thermosetting resins is less than the above lower limit, there may be a case in which it is difficult to form an insulating layer. If more than the above upper limit, hardness of the buildup layer may be reduced.

When a cyanate resin (particularly a novolac-type cyanate resin) is used as the thermosetting resin for the buildup layer, it is preferable to use the cyanate resin and the epoxy resin (substantially free from a halogen atom) in combination.

As examples of the epoxy resin which can be used in combination with the cyanate resin, bisphenol-type epoxy resins such as a bisphenol A epoxy resin, a bisphenol F epoxy resin, a bisphenol E-type epoxy resin, a bisphenol S-type epoxy resin, a bisphenol Z-type epoxy resin, a bisphenol P-type epoxy resin, and a bisphenol M-type epoxy resin; novolac-type epoxy resins such as a phenol novolac-type epoxy resin and a cresol novolac-type epoxy resin; arylalkylene-type epoxy resins such as a biphenyl-type epoxy resin, xylylene-type epoxy resin, and a biphenyl aralkyl-type epoxy resin; a naphthalene-type epoxy resin, an anthracene-type epoxy resin, a phenoxy-type epoxy resin, a dicyclopentadiene-type epoxy resin, a norbornene-type epoxy resin, an adamantane-type epoxy resin, and a fluorene-type epoxy resin can be given.

One type of the above-mentioned epoxy resins may be used alone, two or more types of the epoxy resins, each having a molecular weight differing from the other, may be used in combination, or one type or two or more types of the epoxy resins and prepolymers of these epoxy resins may be used in combination.

Of these epoxy resins, arylalkylene-type epoxy resins are particularly preferable. The arylalkylene epoxy resins can promote moisture-absorption solder heat resistance and flame retardancy.

The term "arylalkylene-type epoxy resin" refers to an epoxy resin containing one or more arylalkylene groups in the repeating units. For example, a xylylene epoxy resin, a biphenyl dimethylene-type epoxy resin, and the like can be given. Of these, the biphenyl dimethylene-type epoxy resin is preferable. As the biphenyl dimethylene-type epoxy resin, the compound of the following formula (2) can be given, for example.

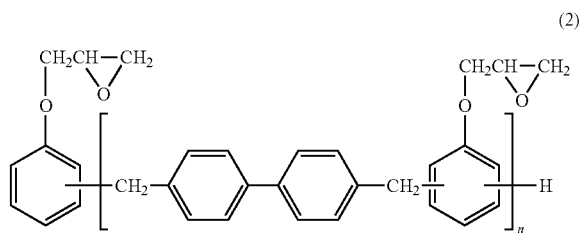

(2)

Although there are no particular limitations, the average number of repeating units n of the biphenyldimethylene type epoxy resin shown by the above formula (2) is preferably 1 to 10, and particularly preferably 2 to 5. The biphenyl dimethylene-type epoxy resin having the average number of repeating units n of less than the above lower limit may be handled with difficulty since such the resin is easily crystallized and has comparatively low solubility in commonly used solvents.

If the average number of repeating units n is larger than the above upper limit, the flowability of the resin is reduced, which may impair formability. The resin in which these characteristics are well-balanced can be obtained when the average number of the repeating units n is in the above range.

Although there are no particular limitations to the amount of the epoxy resins, an amount of 1 to 55 wt %, particularly 5 to 40 wt %, of the total amount of the resin composition is preferable. If the amount of the epoxy resins is less than the above lower limit, there may be a case in which the cyanate resin exhibits reduced reactivity or the resulting product has low moisture resistance. If more than the above upper limit, the effect of reducing the linear expansion can be achieved only with difficulty and the heat resistance may be reduced.

Although there are no particular limitations, the weight average molecular weight of the epoxy resin is preferably 500 to 20,000, and particularly preferably 800 to 15,000. If the weight average molecular weight is less than the above lower limit, there may be a case in which the surface of the buildup layer has tackiness. If more than the above upper limit, the solder heat resistance may be impaired. The balance of these characteristics can be improved when the average number of the repeating units n is in the above range.

The weight average molecular weight of the epoxy resin can be measured by GPC, for example.

The thermosetting resin composition for the above-mentioned buildup layer preferably contains a film-forming resin. Use of the film-forming resin can further improve film-forming properties and handling properties when preparing a buildup layer with a carrier substrate. The term "film-forming resin" refers to a resin which, when a certain amount is added to a resin varnish, can automatically provide the surface with smoothness and exhibit an appropriate tackiness during the process of coating the carrier substrate with a varnish and drying the coating to produce a film, Examples of the film-forming resin include a phenoxy resin, a bisphenol F resin, and an olefin resin. One type of these film-forming resins may be used alone, two or more types of the film-forming resins, each having a molecular weight differing from the other, may be used in combination, or one type or two or more types of the film-forming resins and prepolymers of these film-forming resins may be used in combination. Of these, the phenoxy resin is preferable. The phenoxy resin can promote heat resistance and flame retardancy.

Examples of the phenoxy resin include, but are not limited to, phenoxy resins having a bisphenol skeleton such as a phenoxy resin having a bisphenol A skeleton, a phenoxy resin having a bisphenol F skeleton, a phenoxy resin having a bisphenol S skeleton, a phenoxy resin having a bisphenol M skeleton, a phenoxy resin having a bisphenol P skeleton, and a phenoxy resin having a bisphenol Z skeleton; a phenoxy resin having a novolac skeleton, a phenoxy resin having an anthracene skeleton, a phenoxy resin having a fluorine skeleton, a phenoxy resin having a dicyclopentadiene skeleton, a phenoxy resin having a norbornene skeleton, a phenoxy resin having a naphthalene skeleton, a phenoxy resin having a biphenyl skeleton, and a phenoxy resin having an adamantane skeleton.

A phenoxy resin of a structure having two or more of these skeletons or a phenoxy resin containing different skeletons at a different ratio can be used. Two or more types of the phenoxy resins, each having a skeleton differing from the other, or two or more types of the phenoxy resins, each having a molecular weight differing from the other may be used. Prepolymers of these phenoxy resins may also be used in combination.

Among these, a phenoxy resin having a biphenyl skeleton and a bisphenol S skeleton can be preferably used since such a phenoxy resin possesses a high glass transition temperature due to rigidity of the biphenyl skeleton and exhibits improved plating metal adhesion in the fabrication of multilayer circuit boards due to the presence of the bisphenol S skeleton.

A phenoxy resin having a bisphenol A skeleton and a bisphenol F skeleton can also be used. Use of the phenoxy resin having a bisphenol A skeleton and a bisphenol F skeleton can improve adhesion of the film-forming resin to the inner layer circuit board during fabrication of the multilayer circuit board. Furthermore, a phenoxy resin having a biphenyl skeleton and a bisphenol S skeleton can be used in combination with a phenoxy resin having a bisphenol A skeleton and a bisphenol F skeleton.

Although there are no specific limitations to the molecular weight of the film-forming resin, a film-forming resin having a weight average molecular weight of 1000 to 100,000 is preferable, with a more preferable weight average molecular weight being 10,000 to 60,000.

If the weight average molecular weight of the film-forming resin is less than the above lower limit, the effect of improving the film-forming properties may not be sufficient. If more than the above upper limit, on the other hand, there is a case that the film-forming resin has low solubility. Balance of these characteristics can be improved when the weight average molecular weight of the film-forming resin is in the above range.

Although there are no specific limitations to the content of the film-forming resin, the content in the range of 1 to 40 wt % of the resin composition is preferable, with a more preferable range being 5 to 30 wt %. If the content of the film-forming resin is less than the above lower limit, the effect of improving the film-forming properties may not be sufficient. If more than the above upper limit, on the other hand, there may be a case in which the effect of providing a reduced coefficient of linear expansion is impaired because of a relatively small content of the cyanate resin. Balance of these characteristics can be improved when the content of the film-forming resin is in the above range.

It is preferable that the thermosetting resin used for forming the buildup layer and the film-forming resin preferably do not substantially contain a halogen atom. The thermosetting resins and film-forming resins substantially not containing a halogen atom can provide the buildup layer and the film-forming resin with flame retardancy. The term "substantially not containing a halogen atom" refers to the resin, for example, an epoxy resin or a phenoxy resin with a halogen atom content of 0.15 wt % or less (as determined by JPCA-ES01-2003).

A curing promoter may be used, as required, in the thermosetting resin composition for the above-mentioned buildup layer. As the curing promoter, commonly known curing promoters can be used. Examples include imidazole compounds, organic metal salts such as zinc naphthenate, cobalt naphthenate, stannous octoate, cobalt octoate, bisacetylacetonato cobalt (II), and trisacetylacetonato cobalt (III); tertiary amines such as triethylamine, tributylamine, and diazabicyclo[2,2,2]octane; phenolic compounds such as phenol, bisphenol A, and nonylphenol; and organic acids such as acetic acid, benzoic acid, salicylic acid, and paratoluenesulfonic acid. Mixtures of these compounds may also be used. These compounds, as well as derivatives of these compounds, may be used as the curing promoter either individually or in combination of two or more.

Of these curing promoters, imidazole compounds are particularly preferable. The moisture absorption solder heat resistance can be further improved by using the imidazole compounds. Although not particularly limited, the imidazole compounds having compatibility with the above-mentioned cyanate resin, epoxy resin, and film-forming resin component are preferably used.

The term "having compatibility with the above-mentioned cyanate resin, epoxy resin, and film-forming resin component" refers to the properties of the imidazole compound of dissolving or dispersing substantially to a molecular level when the imidazole compound is mixed with the above-mentioned cyanate resin, epoxy resin, or film-forming resin component or when the imidazole compound is mixed with the above-mentioned cyanate resin, epoxy resin, or film-forming resin component together with an organic solvent.

Use of such an imidazole compound can effectively promote the reaction of the cyanate resin and epoxy resin in the thermosetting resin composition for the buildup layer. In addition, it is possible to improve heat resistance and to provide the buildup layer with a low coefficient of linear expansion and low moisture absorption properties, even if the amount of the imidazole compounds is decreased.

Furthermore, the thermosetting resin composition for the buildup layer in which such an imidazole compound is used can be cured with high homogeneity in a minute matrix unit among the resin component. Curing with such high homogeneity can increase insulating properties and heat resistance of the buildup layer formed on the multilayer circuit board.

The buildup layer formed from such a thermosetting resin composition can form a great number of highly uniform minute irregularities on the surface when roughened using an oxidant such as a permanganate or a dichromate.

If the surface of the buildup layer after such a roughening treatment is plated with a metal, a minute conductor circuit can be formed with sufficient accuracy thereon due to high smoothness after the roughening treatment. In addition, an anchoring effect is promoted by minute irregularities which provide high adhesiveness between the buildup layer and the plated metal.

Examples of the imidazole compound used in the thermosetting resin composition for the buildup layer include 1-benzyl-2-methylimidazole, 1-benzyl-2-phenylimidazole, 2-phenyl-4-methylimidazole, 2-ethyl-4-methylimidazole, 2,4-diamino-6-[2'-methylimidazolyl-(1')]-ethyl-s-triazine, 2,4-diamino-6-(2'-undecylimidazolyl)-ethyl-s-triazine, 2,4-diamino-6-[2'-ethyl-4-methylimidazolyl(1')]-ethyl-s-triazine, 2-phenyl-4,5-dihydroxymethylimidazole, and 2-phenyl-4-methyl-5-hydroxymethylimidazole.

Of these, the imidazole compound selected from the group consisting of 1-benzyl-2-methylimidazole, 1-benzyl-2-phenylimidazole, and 2-ethyl-4-methylimidazole is preferable. Since these imidazole compounds can produce a highly homogeneous cured product and can form a minute and uniform roughened surface due to particularly excellent compatibility, not only a minute conductor circuit can be fabricated with ease, but also the multilayered circuit board can be provided with high heat resistance.

Although there are no particular limitations to the amount of the imidazole compounds, an amount of 0.01 to 5 wt %, particularly 0.05 o 3 wt %, of the total amount of the cyanate resin and the epoxy resin is preferable. Use of the imidazole compounds in this range can particularly improve heat resistance.

The thermosetting resin composition for the buildup layer preferably contains an inorganic filler. The inorganic filler can promote low coefficient of linear expansion properties and flame retardancy. Modulus of elasticity can be promoted by the combination of the cyanate resin and/or prepolymer (especially novolac-type cyanate resin) and the inorganic filler.

As examples of the inorganic filler, talc, sintered clay, non-sintered clay, mica, silicate such as glass, oxides such as titanium oxide, alumina, silica, and molten silica, carbonates such as calcium carbonate, magnesium carbonate, and hydrotalcite, hydroxides such as aluminium hydroxide, magnesium hydroxide, and calcium hydroxide, sulfates or sulfites such as barium sulfate, calcium sulfate, and calcium sulfite, borates such as zinc borate, barium metaborate, aluminum borate, calcium borate, and sodium borate, nitrides such as aluminium nitride, boron nitride, silicon nitride, and carbon nitride, and titanates such as strontium titanate and barium titanate can be given. These inorganic fillers may be used either individually or in combination of two or more. Of these, silica is preferable, with molten silica (especially spherical molten silica) being particularly preferable due to the capability of reducing the coefficient of linear expansion. Silica may have a crushed form or a spherical form. The forms are selected according to the purpose of use. For example, the spherical silica is used to reduce the melt viscosity of the resin composition in order to ensure impregnation in a fiber substrate.

Although there are no specific limitations, the average particle diameter of the inorganic fillers is preferably 0.01 to 5 µm. A more preferable average particle size is 0.1 to 2 µm.

The average particle diameter of the inorganic filler less than the above lower limit may affect processability when fabricating the buildup layer with a carrier substrate since the resin varnish prepared from the resin composition containing such an inorganic filler has a high viscosity. If more than the above upper limit, phenomena such as precipitation of the inorganic filler in a resin varnish may occur. The balance of these characteristics can be improved when the average particle diameter of the inorganic filler is in the above range.

Either an inorganic filler with a monodisperse average particle diameter or an inorganic filler with a multi-disperse average particle diameter can be used without specific limitations. In addition, either one type of the inorganic filler with a monodisperse average particle diameter and the inorganic filler with a multi-disperse average particle diameter may be used alone or two or more types of the inorganic filler may be used in combination.

Although there are no specific limitations to the content of the inorganic filler, the content in the range of 20 to 70 wt % of the resin composition is preferable, with a more preferable range being 30 to 60 wt %.

If the content of the inorganic filler is less than the above lower limit, the effect of providing the resin composition with a low coefficient of linear expansion and low moisture adsorbing properties may be impaired. If more than the above upper limit, moldability of the buildup layer may be impaired due to reduced flowability of the resin composition. Balance of these characteristics can be improved when the content of the inorganic filler is in the above range.

Although not particularly limited, a coupling agent is preferably used in the thermosetting resin composition for the buildup layer. Use of the coupling agent can increase wettability in the interface between the above thermosetting resin and the inorganic fillers, whereby heat resistance and particularly moisture absorption solder heat resistance can be promoted.

Any commonly-used coupling agent can be used as the above-mentioned coupling agent. Specifically, it is desirable to use one or more coupling agents selected from the group consisting of an epoxy silane coupling agent, a cationic silane coupling agent, an aminosilane coupling agent, a titanate coupling agent, and a silicone oil coupling agent. Use of these coupling agents can increase wettability in the interface of the inorganic fillers, whereby heat resistance can be promoted.

Although there are no particular limitations to the content of the coupling agent, the content in the range of 0.05 to 3 parts by weight for 100 parts by weight of the inorganic filler is preferable. If the content of the coupling agent is less than the above lower limit, the effect of improving heat resistance by covering the inorganic filler may not be sufficient. If more than the above upper limit, on the other hand, there is a case in which the buildup layer has poor bending strength. The balance of these characteristics can be improved when the content of the coupling agent is in the above range.

The thermoplastic resin such as a phenoxy resin, a polyimide resin, a polyamideimide resin, a polyphenylene oxide resin, a polyether sulfone resin, a polyester resin, a polyethylene resin, and a polystyrene resin; polystyrene thermoplastic elastomers such as a styrene butadiene copolymer and a styrene isoprene copolymer; thermoplastic elastomers such as a polyolefin thermoplastic elastomer, a polyamide elastomer, and a polyester elastomer; and diene elastomers such as polybutadiene, epoxy-modified polybutadiene, acryl-modified polybutadiene, and methacryl-modified polybutadiene may also be used in the thermosetting resin composition for the buildup layer in combination with the thermosetting resins.

In addition to the above components, additives such as a pigment, a dye, a defoamer, a leveling agents, a UV absorber, a foaming agent, an antioxidant, a flame retardant, and an ion capture agent may be added, as required, to the thermosetting resin composition for the buildup layer.

The method for forming the buildup layer on a carrier substrate using the thermosetting resin composition includes, but is not limited to, a method of dissolving or dispersing the resin composition in a solvent to obtain a resin varnish, applying the resin varnish to the carrier substrate using various coaters and drying the coating, and a method of spraying the resin varnish onto the carrier substrate using a sprayer and drying the coating.

Of these, the method of applying the resin varnish to the carrier substrate using various types of coating device such as a comma coater, a die coater, and the like, and drying after the application is preferable. A buildup layer with a carrier substrate without a void and having a uniform thickness can be efficiently produced by using these methods.

Although not particularly limited, a thermoplastic resin film having heat resistance such as a polyester resin (e.g. polyethyleneterephthalate and polybuthyleneterephthalate), a fluororesin, and a polyimide resin, or a metal foil such as a foil of copper, a copper alloy, aluminum, an aluminum alloy, iron, an iron alloy, silver, a silver alloy, gold, a gold alloy, zinc, a zinc alloy, nickel, a nickel alloy, tin, or a tin alloy can be used.

Although not particularly limited, the carrier substrate with a thickness of 10 to 100 µm is preferable due to easy handling when preparing a buildup layer with a carrier substrate.

A solvent in which the resin component in the thermosetting resin composition exhibits good solubility is preferably used for preparing the resin varnish, but a poor solvent may be used to the extent that the solvent exhibits no adverse effect. As examples of the solvent in which the resin has good solubility, acetone, methyl ethyl ketone, methyl isobutyl ketone, cyclohexanone, tetrahydrofuran, dimethyl formamide, dimethyl acetamide, dimethyl sulfoxide, ethylene glycol, cellosolve, carbitol, and the like can be given.

Although there are no particular limitations to the amount of solid components in the above resin varnish, an amount of 30 to 80 wt %, particularly 40 to 70 wt %, of the total amount of the resin composition is preferable.

Although there are no specific limitations to the thickness of the buildup layer formed from the resin composition, a thickness of 5 to 100 µm is preferable, with a thickness of 10 to 80 µm being more preferable. If the thickness is in the above range, a multilayer circuit board can be formed using the buildup layer, while filling irregularities of the inner layer circuit and ensuring a preferable buildup layer thickness.

Next, materials for forming a buildup layer containing a fiber substrate (hereinafter referred to from time to time as "fiber substrate-containing buildup layer forming material") will be described. In the fiber substrate-containing buildup layer forming material, the thermosetting resin composition of the buildup layer is supported on the fiber substrate. The thickness of the fiber substrate is 5 to 35 µm, preferably 5 to 25 µm, and particularly preferably 10 to 20 µm. If the thickness of the fiber substrate is within the above range, the balance between the later-described substrate thinning and strength of substrate is excellent. Moreover, the fiber substrate-containing buildup layer forming material exhibits excellent processability and high reliability of interlayer connection.

As examples of such a fiber substrate-containing buildup layer forming material, glass fiber substrates such as a woven glass fabric and a nonwoven glass fabric; polyamide resin fibers such as polyamide resin fiber, an aromatic polyamide resin fiber, and an all aromatic polyamide resin fiber; polyester resin fibers such as a polyester resin fiber, an aromatic polyester resin fiber, and an all aromatic polyester resin fiber; synthetic fiber substrates consisting of woven or nonwoven fabrics containing a polyimide resin fiber, a fluororesin fiber, and the like as the major components; organic fiber substrates containing a paper substrate such as a kraft paper, a cotton-linter paper, a mixed paper of cotton linter and kraft pulp, and the like as the major components can be given. Of these, the glass fiber substrate is preferable. Use of a fiber substrate can promote the strength of the buildup layer and can reduce the coefficient of thermal expansion of the buildup layer.

As examples of the glass that forms these glass fibers, E glass, C glass, A glass, S glass, D glass, NE glass, T glass, and H glass can be given. Of these, T glass is preferable. Use of T-glass can reduce the coefficient of thermal expansion of the glass substrate, whereby the coefficient of thermal expansion of the buildup layer can be reduced.

As the method for producing the fiber substrate-containing buildup layer forming material, a method of previously applying a thermosetting resin composition for the buildup layer onto a carrier film to obtain a thin film supported on the carrier film, laminating the thin film on the fiber substrate, and peeling the carrier film can be given (this method is hereinafter referred to from time to time as "laminating method of producing the fiber substrate-containing buildup layer forming material"). This method ensures production of a fiber substrate-containing buildup layer forming material consisting of a resin material carried on a fiber substrate particularly with a thickness of 35 μm or less.

Figure 2:
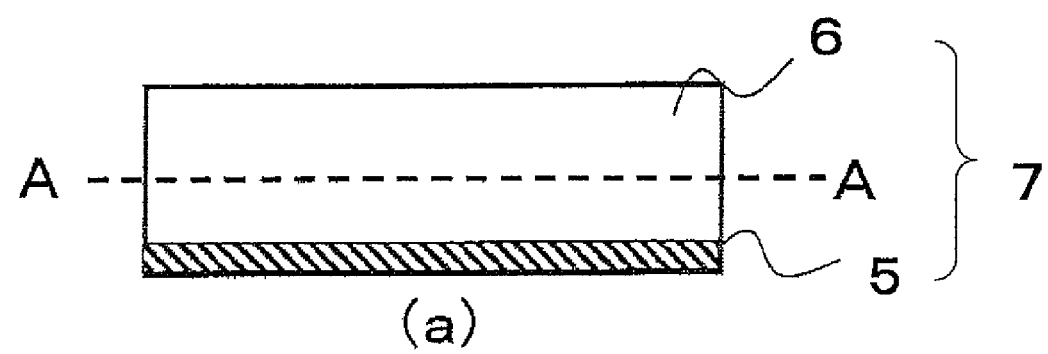
FIGS. 2(a) and 2(b) are schematic cross-sectional views showing the state in which the fiber substrate is unevenly distributed in the fiber substrate-containing buildup layer material.
Figure 2:
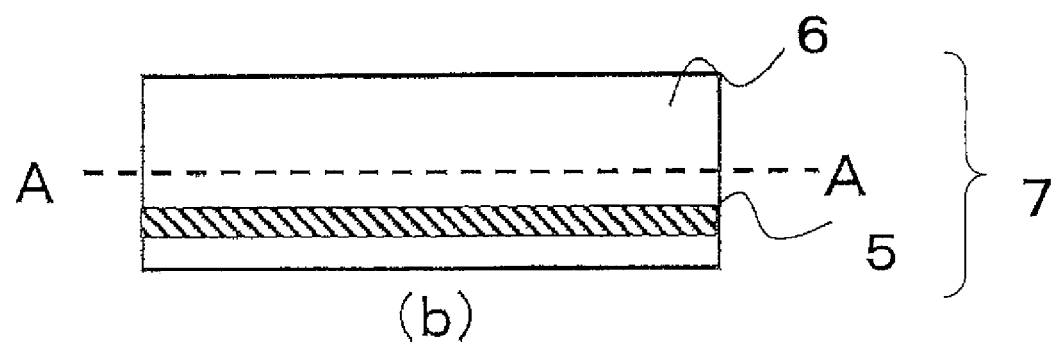

In the laminating method of producing the fiber substrate-containing buildup layer forming material, the fiber substrate may be unevenly distributed in the thickness direction of the fiber substrate-containing buildup layer forming material. In this instance, the amount of the resin may be adjusted according to the circuit pattern. The state of the fiber substrate unevenly distributed in the thickness direction of the fiber substrate-containing buildup layer forming material is described referring to FIG. 2. FIGS. 2(a) and 2(b) are cross-sectional views schematically showing the state of a fiber substrate 5 unevenly distributed in the thickness direction of the fiber substrate-containing buildup layer forming material 7. As shown in FIGS. 2(a) and 2(b), the center of the fiber substrate 5 is positioned away from the center line A-A of the thickness direction of the substrate-containing buildup layer forming material 7. In FIG. 2(a), the bottom of the fiber substrate 5 (lower side in FIG. 2) almost coincides with the bottom of the substrate-containing buildup layer forming material 7 (lower side in FIG. 2). In FIG. 2(b), the fiber substrate 5 is disposed between the center line A-A and the bottom of the substrate-containing buildup layer forming material 7 (lower side in FIG. 2). The fiber substrate 5 may be partly superposed over the center line A-A.

In the general method of causing the fiber substrate to be impregnated with the resin varnish using a common coating device and drying the resin varnish, the resin material layers are formed symmetrically on the fiber substrate. In this instance, when the circuit wiring pattern on one side of the buildup layer differs from that on the other side (particularly when the copper residual rate differs), the amount of the resin required for the one side differs from that required for the other side. The general method employed heretofore could not apply exact amounts needed for each of the sides. The resin for forming the buildup layer may overflow or the amount required for filling the circuit pattern may be insufficient when fabricating the substrate.

In the laminating method of producing the fiber substrate-containing buildup layer forming material, since it is possible to cause the fiber substrate 5 to be unevenly distributed in the thickness direction of the fiber substrate-containing buildup layer forming material 7, it is possible to design the amount of the fiber substrate-containing buildup layer forming material 7 according to the buildup circuit pattern. In addition, it is possible not only to produce the fiber substrate-containing buildup layer forming material 7 with a small thickness of 35 μm, but also to reduce the thickness of the ultimately produced semiconductor package by causing the fiber substrate 5 to be unevenly distributed in the thickness direction of the fiber substrate-containing buildup layer forming material 7. This is due to not only the small thickness of the fiber substrate-containing buildup layer forming material 7, but also the capability of eliminating the necessity of providing an excess resin layer by adjusting the amount of resin for the resin material later 6 according to the copper residual rate of the circuit pattern.

By using the fiber substrate-containing buildup layer forming material, particularly preferably by using the fiber substrate-containing buildup layer forming material produced by the laminating method, as the buildup layer forming material, it is possible to produce a buildup layer having a glass transition temperature of 170° C. or more, and preferably 175° C. or more, and a coefficient of linear expansion at 25 to 75° C. in the planer direction of 25 ppm/° C. or less, preferably 5 to 20 ppm/° C., and particularly preferably 5 to 15 ppm/° C.

By using the fiber substrate-containing buildup layer forming material, for example, by using the fiber substrate-containing buildup layer forming material produced by the laminating method as the buildup layer forming material, and the above-mentioned cyanate resin as the thermosetting resin, and particularly preferably by using the fiber substrate-containing buildup layer forming material produced by the laminating method as the buildup layer forming material, and the above-mentioned cyanate resin and the above-mentioned epoxy resin as the thermosetting resin, it is possible to produce a buildup layer having a glass transition temperature of 170° C. or more, and preferably 175° C. or more, and a coefficient of linear expansion at 25 to 75° C. in the planer direction of 25 ppm/° C. or less, preferably 5 to 20 ppm/° C., and particularly preferably 5 to 15 ppm/° C.

It is possible to make the buildup layer having a glass transition temperature of 170° C. or more, preferably 175° C. or more, and a coefficient of linear expansion in the planer direction between 25° C. and 75° C. of preferably 5 to 20 ppm/° C., and particularly preferably 5 to 15 ppm/° C. by using the fiber substrate-containing buildup layer forming material or the fiber substrate-containing buildup layer forming material produced by the laminating method as the buildup layer forming material, in which the thermosetting resin composition contains the cyanate resin in an amount of 5 to 55 wt %, and preferably 20 to 50 wt %, the epoxy resin to be used in combination with the cyanate resin in an amount of 1 to 55 wt %, preferably 2 to 40 wt %, and the phenol resin to be used in combination with the cyanate resin in an amount of 1 to 55 wt %, preferably 5 to 40 wt %.

In addition, it is preferable that the thickness of the resin layer of the fiber substrate-containing buildup layer forming material differ from the thickness of the resin layer of the fiber substrate-containing buildup layer forming material produced by the laminating method.

<Fabrication of Multilayer Circuit Board>

Next, the method for fabricating multilayer circuit board using a buildup layer is described.

The above-mentioned multilayer circuit board 1 is fabricated by superposing the above-mentioned forming material for the buildup layer on either one side or both sides of the above-mentioned core layer on which an inner layer circuit has been formed and heat pressing the laminate. Specifically, the above-mentioned multilayer circuit board 1 can be obtained by superposing the above-mentioned forming material for the buildup layer and the above-mentioned core layer on which an inner layer circuit has been formed, heat pressing the laminate, forming by vacuum heat-pressing using a vacuum heat-press forming laminator or the like, and curing by heating using a hot blast dryer and the like.

Although not particularly limited, heat pressing may be carried out at 60 to 160° C. under pressure of 0.2 to 3 MPa, for example. Although there are no specific limitations, the thermosetting resin composition may be cured by heating at a temperature of 140 to 240° C. for 30 to 120 minutes. Alternatively, it is possible to heat press the laminate obtained by superposing the above-mentioned forming material for the buildup layer and the above-mentioned core layer on which an inner layer circuit has been formed using a platen press or the like. Although not particularly limited, heat pressing according to this method may be carried out at 140 to 240° C. under a pressure of 1 to 4 MPa, for example. A further buildup layer can be formed by repeating this procedure.

<Structure of Semiconductor Package>

Next, the flip-chip semiconductor package of FIG. 1 is described.

One embodiment of the method for fabricating a multilayer circuit board of the present invention comprises a process of bonding the semiconductor chip connecting the electrode side of a circuit board 1 and the electrode side of the semiconductor chip 2 by flip-chip bonding technique and a process of sealing an under fill part by injecting a sealing resin composition between the circuit board 1 and the semiconductor chip 2.

In the injection process, while heating the semiconductor package obtained by flip-chip bonding of the circuit board 1 and the semiconductor chip 2 before filling the sealing resin composition, the sealing resin composition is applied to the side edge of the semiconductor chip 2 to cause the resin composition to spread over the clearance by the capillary phenomenon. A method of causing the semiconductor package to incline or a method of accelerating the injection speed by applying a pressure difference may be used in combination in order to shorten the production cycle.

After completion of the injection process, it is possible to apply the sealing resin composition to the side edge of the semiconductor chip 2 to adjust the shape of the fillet section 4b into an optional configuration.

After filling or coating the sealing resin composition, the sealing resin composition is cured by heating at 100 to 170° C. for 1 to 12 hours. The curing temperature profile may be altered. Curing by heating while changing the temperature stepwise, for example, a method of heating at 100° C. for one hour, then heating at 150° C. for two hours, may be employed.

The viscosity of the sealing resin composition for forming the cured member 4 is preferably 50 Pa·sec or less (25° C.). The circuit board 1 is also selected from those having the properties described in the above embodiment of the semiconductor package.

The viscosity of the sealing resin composition when injected is preferably 2 Pa·sec or less. The injecting temperature is 60 to 140° C., and more preferably 100 to 120° C. Although the properties of the cured member 4 of the sealing resin composition and the properties of the circuit board 1 were adjusted so as to reduce the stress in the above embodiment, such adjustment is optional.

EXAMPLES

The present invention will be described by way of examples, which are not intended to limit the present invention.

1. Property Test of Sealing Resin Composition Cured Member

The sealing resin compositions a to d were prepared. Table 1 shows the formulation of the sealing resin compositions and the results of measuring the glass transition temperature, coefficient of linear expansion, modulus of elasticity, and viscosity of the cured products of the sealing resin compositions, wherein the amount is shown as a part by weight.

In measuring the glass transition temperature, a test specimen was prepared by curing the sealing resin composition at 150° C. for 120 minutes and cutting the cured product into a size of 5×5×10 mm. The glass transition temperature of the test specimen was measured using a TMA/SS120 analyzer (manufactured by Seiko Instruments Inc.) under the conditions of a compressive load of 5 g, while increasing the temperature from −100° C. to 300° C. at a rate of 10° C./min. The coefficient of linear expansion between 25° C. to 75° C. was obtained by the same measuring method. The coefficient of linear expansion in the temperature range of 25° C. to 75° C. in which the coefficient of linear expansion is almost straight was determined according to JIS C6481.

In measuring the modulus of elasticity, the sealing resin composition was cured by heating at 150° C. for 120 minutes in an oven and formed into a test specimen with a size of 10×150×4 mm, which was subjected to a Tension tester to obtain a stress-strain curve by the three-point bending mode at a span of 64 mm and a rate of 1 mm/min at 25° C. The modulus of elasticity was calculated from the gradient of the resulting stress-strain curve. The result was regarded as the bending modulus of elasticity.

The viscosity measurement at 25° C., was carried out using a Brookfield-type viscometer equipped with CP-51 cone at 5 rpm. The viscosity measurement at 110° C. was carried out using Rheo Stress RS150-type rheometer manufactured by Haaake Co., equipped with a PP-60 cone plate at 1 Hz.

TABLE 1

| | | | Sealing resin composition | | | |
|---|---|---|---|---|---|---|
| | General name | Trade name | a | b | c | d |
| Epoxy resin | Bisphenol F-type epoxy resin | EXA-830LVP | 100 | 65 | 65 | 0 |
| | Three-functional glycidyl amine | E-630 | 0 | 35 | 35 | 100 |
| Curing agent | Aromatic primary amine curing agent | Kayahard AA | 36 | 46 | 46 | 62 |

TABLE 1-continued

|  |  |  | Sealing resin composition | | | |
| --- | --- | --- | --- | --- | --- | --- |
|  | General name | Trade name | a | b | c | d |
| Silane coupling agent | Epoxy silane coupling agent | KBM-403 | 5 | 5 | 5 | 15 |
| Additive | Stress reducing agent | E-1800-6.5 | 5 | 5 | 5 | 2 |
|  | Diluent | DGME | 2 | 2 | 2 | 5 |
| Filler | Synthetic spherical silica 1 | Admatecs | 222 | 293 | 130 | 0 |
|  | Synthetic spherical silica 2 | (Blend) | 0 | 0 | 0 | 735 |
| Properties | Filler content | | 60% | 65% | 45% | 80% |
|  | Glass transition temperature (° C.) | | 70 | 95 | 97 | 127 |
|  | Coefficient of linear expansion (ppm/° C.) | | 32 | 24 | 40 | 12 |
|  | Bending modulus of elasticity (Gpa: 25° C.) | | 9 | 10 | 7 | 12 |
|  | Viscosity (25° C.) (Pa · sec) | | 13 | 25 | 3.5 | 157 |

EXA-830LVP: Bisphenol F-type epoxy resin, manufactured by Dainippon Ink and Chemicals, Inc., epoxy equivalent: 161

E-630: N,N-bis(2,3-epoxypropyl)-4-(2,3-epoxypropoxy) aniline, manufactured by Japan Epoxy Resins Co., Ltd., epoxy equivalent: 97.5

Kayahard AA: 3,3'-diethyl-4,4'-diaminophenylmethane manufactured by Nippon Kayaku Co., Ltd., active hydrogen equivalent: 63.5

KBM-403: 3-glycidoxypropyltrimethoxysilane, molecular weight: 236.3, theoretical coating area: 330 m$^2$/g manufactured by Shin-Etsu Chemical Co., Ltd.

E-1800-6.5: Epoxy-modified polybutadiene, number average molecular weight: 1800, epoxy equivalent: 250, manufactured by Nippon Petrochemicals Co., Ltd.

DGME: Reagent diethylene glycol monoethyl ether manufactured by Wako Pure Chemical Co., Ltd.

Synthetic spherical silica 1 (Admatecs): 45:40:15 mixture of synthetic spherical silica SE-6200 (average particle diameter: 2.5 μm), SO-E3 (average particle diameter: 1 μm), and SO-E2 (average particle diameter: 0.5 μm) manufactured by Admatecs Co. Ltd. Synthetic spherical silica 2: 30:70 mixture of synthetic spherical silica SO-E2 manufactured by Admatecs Co. Ltd. (average particle diameter: 0.5 μm) and synthetic spherical silica SEMICONDUCTOR PACKAGES-10G manufactured by Fuso Chemical Co., Ltd. (average particle diameter of 41m)

2. Buildup Layer Property Test

APL3651, APL3601, ABF-GX 13, and the later-described buildup layer forming materials were used for forming the buildup layers. A buildup layer with a thickness of 80 μm was prepared by laminating two sheets of buildup layer forming material using an ordinary pressure laminator. APL3651 and APL3601 were cured at 20° C. for two hours and ABF-GX13 was cured at 180° C. for two hours. Tables 2 and 3 show the results of measuring the glass transition temperature, coefficient of linear expansion, and modulus of elasticity of the buildup layer (cured products of the buildup layer forming materials).

<Buildup Layer Forming Material 1>

24 wt % of a cyanate resin (Primaset PT-30 manufactured by Lonza Japan, weight average molecular weight: about 2,600) as a thermosetting resin, 24 wt % of a biphenyldimethylene-type epoxy resin (NC-3000 manufactured by Nippon Kayaku Co., Ltd., epoxy equivalent: 275) as an epoxy resin, 11.8 wt % of a copolymer of a bisphenol A-type epoxy resin and a bisphenol F-type epoxy resin, of which the terminal is a phenoxy resin having an epoxy group (EP-4275, manufactured by Japan Epoxy Resins Co., Ltd., weight average molecular weight: 60,000) as a phenoxy resin, and 0.2 wt % of an imidazole compound (2-phenyl-4,5-dihydroxymethylimidazole manufactured by Shikoku Chemicals Corp.) as a curing catalyst were dissolved in methyl ethyl ketone. 39.8 wt % of spherical molten silica (SO-25H manufactured by Admatecs Co. Ltd., average particle diameter: 0.5 μm) as an inorganic filler and 0.2 wt % of an epoxy silane coupling agent (A-187 manufactured by Nippon Unicar Co., Ltd.) were further added, and the mixture was stirred for 60 minutes using a high speed agitator to obtain a resin varnish a with a solid content of 60 wt %.

The resin varnish a was applied to a polyethylene terephthalate film (SFB-38 manufactured by Mitsubishi Chemical Corp., thickness: 38 μm, width: 480 mm) used as a carrier film using a comma coater. The coating was dried in a drier at 170° C. for three minutes to obtain a resin layer (prior to being prepared as a buildup layer forming material) with a thickness of 14 μm and a width of 410 mm) on a carrier substrate.

Specifically, the resin layers (prior to being prepared as a buildup layer forming material) were superposed on both sides of the woven glass fabric so that the resin layers were disposed in the center of the woven glass fabric in the width direction and bonded using a laminate roller at 80° C. under a reduced pressure of 1330 Pa.

In the inside area of the woven glass fabric in the width direction, the resin layers (prior to being prepared as a buildup layer forming material) on the carrier substrate were bonded to both sides of the woven fiber fabric, whereas, in the outside area of the woven glass fabric in the width direction, the resin layers on the carrier substrate were directly bonded.

Next, the bonded material was treated with heat by being caused to pass through a hot blast drier at 120° C. for two minutes without applying pressure to obtain a buildup layer forming material 1 with a thickness of 35 μm (first resin layer: 10 μm, fiber substrate: 15 μm, second resin layer: 10 μm).

<Buildup Layer Forming Material 2>

15 wt % of a novolac-type cyanate resin (Primaset PT-30 manufactured by Lonza Japan, weight average molecular weight: about 2600) as a thermosetting resin, 8.7 wt % of a biphenyldimethylene-type epoxy resin (NC-3000 manufactured by Nippon Kayaku Co., Ltd., epoxy equivalent: 275) as an epoxy resin, and 6.3 wt % of a biphenyldimethylene phenol resin (MEH-7851-S manufactured by Meiwa Plastic Industries, Ltd., hydroxyl equivalent: 203) as a phenol resin were dissolved in methyl ethyl ketone. A buildup layer forming material 2 with a thickness of 35lm (first resin layer: 10 μm, fiber substrate: 15 μm, second resin layer: 10 μm) was prepared in the same manner as in the buildup layer forming material 1, except for using a resin varnish b with a solid content of 60 wt % prepared by adding 69.7 wt % of spherical molten silica (SO-25H manufactured by Admatecs Co. Ltd., average particle diameter: 0.5 μm) as an inorganic filler and 0.3 wt % of an epoxy silane coupling agent (A-187 manufactured by Nippon Unicar Co., Ltd.), and stirring the mixture for 60 minutes using a high speed agitator.

<Buildup Layer Forming Material 3>

The buildup layer forming material 3 was prepared in the same manner as in the buildup layer forming material 1, except that the thickness of the resin layers was changed to 5 μm and 10 μm. In changing the thickness of the resin layer, the amount of the resin varnish a to be applied was changed so that the resin layer with a thickness of 5 μm in the buildup layer forming material was formed by causing a resin layer (prior to being prepared as the buildup layer forming material) with a thickness of 9 μm and a width of 360 mm to be formed in the center of the carrier film in the width direction. The buildup layer forming material 3 was prepared by placing a woven glass fabric (cloth type #1015, width: 360 mm, thickness: 15 μm, weight: 17 g/m²) between two resin layers (prior to being prepared as a buildup layer forming material), each having a thickness differing from the other, and using a vacuum laminator and a hot blast drier. The thickness was 30 μm (first resin layer: 5 μm, fiber substrate: 15 μm, second resin layer: 10 μm).

<Buildup Layer Forming Material 4>

A buildup layer forming material 4 was prepared by using the two resin varnishes a and b which were used for the buildup layer forming material 1 and the buildup layer forming material 2. The buildup layer forming material 4 was prepared by changing the resin layer thickness of the buildup layer forming material so that the thickness of resin varnish a is 5 μm and the thickness of the resin varnish b is 10 μm in the same manner as in the buildup layer forming material 1. The thickness was 40 μm (first resin layer: 5 μm, fiber substrate: 24 μm, second resin layer: 11 μm). The thickness of the resin layer prior to being prepared as the buildup layer forming material was respectively 12 μm and 18 μm.

[Glass Transition Temperature and Modulus of Elasticity]

5 mm×30 mm test specimens for evaluation were prepared from the cured product of the buildup layer forming materials obtained above.

Dynamic viscoelasticity was measured by applying a strain at a frequency of 10 Hz while increasing the temperature at a rate of 5° C./min using a dynamic viscoelasticity meter (DMA) (DMS6100 manufactured by SEIKO Instrument Co., Ltd.). The glass transition temperature (Tg) was judged from the peak value of tan δ. In addition, the modulus of elasticity at 25° C. and 250° C. was determined.

[Glass Transition Temperature and Coefficient of Linear Expansion]

4 mm×20 mm test specimens for evaluation were prepared from the cured product of the buildup layer forming materials obtained above.

The coefficient of linear expansion was measured using TMA (manufactured by TA Instrument Co.) while increasing the temperature at a rate of 10° C./min. $\alpha 1$ is the coefficient of linear expansion at a temperature below the glass transition temperature. A coefficient of linear expansion in the planer direction between 25° C. and 75° C. was measured. $\alpha 2$ is the coefficient of linear expansion at a temperature above the glass transition temperature. The coefficient of linear expansion in the temperature range of 25° C. to 75° C. was determined according to JIS C6481 in the temperature range of 25° C. to 75° C. in which the coefficient of linear expansion is almost straight.

TABLE 2

| Buildup layer | | APL 3615 | APL 3601 | ABF-GX13 |
|---|---|---|---|---|
| Glass transition temperature (TMA) | (° C.) | 180< | 180 | 165 |
| Glass transition temperature (DMA) | (° C.) | 250 | 240 | 190 |
| Coefficient of linear expansion (X, Y) | α1 (ppm) | 16 | 30 | 46 |
| | α2 (ppm) | 13 | 90 | 120 |
| Modulus of elasticity | 25° C. (GPa) | 12 | 13 | 4 |
| | 250° C. (GPa) | 5.7 | 0.8 | 0 |

TABLE 3

| | | Forming material | | | | |
|---|---|---|---|---|---|---|
| Buildup layer | | 1 | 2 | 3 | 4 | 5 |
| Glass transition temperature (TMA) | (° C.) | 180< | 180< | 180< | 180< | 180< |
| Glass transition temperature (DMA) | (° C.) | 250 | 260 | 250 | 260 | 260 |
| Coefficient of linear expansion (X, Y) | α1 (ppm) | 16 | 8 | 16 | 11 | 11 |
| | α2 (ppm) | 13 | 10 | 13 | 11 | 11 |
| Modulus of elasticity | 25° C. (GPa) | 12 | 30 | 12 | 24 | 24 |
| | 250° C. (GPa) | 6 | 19 | 6 | 15 | 15 | thickness was 30 μm (first resin layer: 5 μm, fiber substrate: 15 μm, second resin layer: 10 μm).

<Buildup Layer Forming Material 5>

A buildup layer forming material 5 was prepared in the same manner as in the buildup layer forming material 1 by using two resin varnishes a and b which were used for the buildup layer forming material 1 and the buildup layer forming material 2, and a woven glass fabric (cloth type #1037, thickness: 24 μm, weight: 24 g/m²) as a fiber substrate. The thickness of the resulting buildup layer forming material 5

3. Core Layer Property Test

E679FG, HL832HS-Type HS, ELC4785GS, and the later-described core layer forming materials were used for forming the core layers. Copper foils with a thickness of 0.2 mm and 0.1 mm were removed by etching from a two sided copper clad board. The glass transition temperature, coefficient of linear expansion, and modulus of elasticity of the core layers (cured products of the core layer forming materials) are shown in Table 4.

<Core Layer Forming Material 1>

15 wt % of a novolac-type cyanate resin (Primaset PT-60 manufactured by Lonza Japan, weight average molecular weight: about 2600), 8 wt % of a biphenyldimethylene-type epoxy resin (NC-3000P manufactured by Nippon Kayaku Co., Ltd., epoxy equivalent: 275), 7 wt % of a biphenyldimethylene-type phenol resin (MEH-7851-S manufactured by Meiwa Plastic Industries, Ltd., hydroxyl equivalent: 203), and an epoxy silane-type coupling agent (A-187 manufactured by Nippon Unicar Co., Ltd.) in an amount of 0.3 parts by weight per 100 parts by weight of the later-described inorganic filler were dissolved in methyl ethyl ketone at an ordinary temperature. 20 wt % of spherical molten silica (SFP-10× manufactured by Denki Kagaku Kogyo K.K., average particle diameter: 0.3 μm) and 50 wt % of spherical molten silica (SO-32R manufactured by Admatecs Co. Ltd., average particle diameter: 1.5 μm) were further added as inorganic fillers, and the mixture was stirred using a high speed agitator for 10 minutes to obtain a resin varnish for core layer forming material.

A woven glass fabric (WEA-116E manufactured by Nitto Boseki Co., Ltd., a plain fabric substrate made of E glass, thickness: 100 μm, tissue density of warp yarn: 60/inch, tissue density of weft yarn: 58/inch, coefficient of linear expansion at temperatures from room temperature to 250° C.: 6 ppm/° C.) was impregnated with the resulting resin varnish and dried in a furnace at 120° C. for two minutes to obtain a core layer forming material 1 with a content of varnish solid component (proportion of the resin and silica in the core layer forming material) of about 50%.

A 12 μm copper foil was laminated on both sides of the resulting core layer forming material 1 and formed by heat compression under 4 MPa at 200° C. for two hours to obtain a core layer 1 with a thickness of 0.1 μm.

[Glass Transition Temperature and Modulus of Elasticity]

5 mm×30 mm test specimens for evaluation were prepared from the cured product of the core layer forming materials obtained above.

Dynamic viscoelasticity was measured by applying a strain at a frequency of 10 Hz while increasing the temperature at a rate of 5° C./min using a dynamic viscoelasticity meter (DMA) (DMS6100 manufactured by SEIKO Instrument Co., Ltd.). The glass transition temperature (Tg) was judged from the peak value of tan δ. In addition, the modulus of elasticity at 25° C. was determined.

[Glass Transition Temperature and Coefficient of Linear Expansion]

4 mm×20 mm test specimens for evaluation were prepared from the cured product of the core layer forming materials obtained above.

The coefficient of linear expansion was measured using a TMA (manufactured by TA Instrument Co.) while increasing the temperature at a rate of 10° C./min. α1 is the coefficient of linear expansion in the planer direction between 25° C. and 75° C. The coefficient of linear expansion in the temperature range of 25° C. to 75° C. was determined according to JIS C6481 in the temperature range of 25° C. to 75° C. in which the coefficient of linear expansion is almost straight.

TABLE 4

| Core layer | | E679FG | HL832HS-Type HS | ELC4785GS | Core layer forming material |
|---|---|---|---|---|---|
| Glass transition temperature (TMA) | (° C.) | 170 | 185 | 220 | 180< |
| Glass transition temperature (DMA) | (° C.) | 215 | 215 | 265 | 260 |
| Coefficient of linear expansion (X direction) | α1 (ppm) | 14 | 14 | 11 | 18 |
| Modulus of elasticity (vertical direction) | 25° C. (GPa) | 28 | 29 | 24 | 30 |

4. Reliability Test: Anti-Reflow Test+Heat Cycle Test

Semiconductor packages were prepared by flip-chip mounting using the above-mentioned sealing resin compositions a to d, circuit boards A to D, (the circuit boards A, B, and C were used respectively in Comparative Examples 1, 2, and 3, and the circuit board D was used in Examples 1 and 2), and a silicon chip using combinations shown in Table 5.

The constitutions of the circuit boards A to D are as follows. The following circuit boards have one core layer and three buildup layers respectively above and below the core layer.

Circuit board A: size: 50 mm×50 mm, thickness 0.5 mm (490 μm), circuit layers: 8 (core layer material: E679FG manufactured by Hitachi Chemical Co., Ltd., thickness: 0.2 mm, buildup layer: ABF-GX13 manufactured by Ajinomoto Co., Inc. (with no glass fiber substrate), thickness: 40 μm, SR layers upper and lower sides 25 μm)

Circuit board B: size: 50 mm×50 mm, thickness 0.5 mm (490 μm), circuit layers: 8 (core layer material: HL832 HS-Type HS manufactured by Mitsubishi Gas Chemical Industry, 0.2 mm, buildup layer: ABF-GX13 manufactured by Ajinomoto Co., Inc. (with no glass fiber substrate), thickness: 40 μm, SR layers upper and lower sides 25 μm)

Circuit board C: size: 50 mm×50 mm, thickness 0.5 mm (490 μm), circuit layers: 8 (core layer material: ELC4785GS manufactured by Sumitomo Bakelite Co., Ltd., thickness: 0.2 mm, buildup layer: APL3601 manufactured by Sumitomo Bakelite Co., Ltd. (with no glass fiber substrate), thickness: 40 μm, SR layers upper and lower sides 25 μm)

Circuit board D: size: 50 mm×50 mm, thickness 0.5 mm (490 μm), circuit layers: 8 (core layer material: ELC4785GS manufactured by Sumitomo Bakelite Co., Ltd., thickness: 0.2 mm, buildup layer: APL3651 manufactured by Sumitomo Bakelite Co., Ltd. (with glass fiber substrate), thickness: 40 μm, SR layers upper and lower sides 25 μm)

Using the above sealing resin compositions a to d and the circuit boards E to R (circuit board E was used in Comparative Examples 4 and 7 and Example 3, circuit board F was used in Comparative Examples 5 and 6, circuit board G was used in Example 4, circuit board H was used in Example 5, circuit board I was used in Example 6, circuit board J was used in Example 7, circuit board K was used in Example 8, circuit board L was used in Example 9, circuit board M was used in Example 10, circuit board N was used in Example 11, circuit board O was used in Example 12, circuit board P was used in Example 13, circuit board Q was used in Example 14, and circuit board R was used in Example 15), semiconductor packages of combinations shown in Table 6 were prepared by flip-chip mounting.

The constitutions of the circuit boards E to R are as follows.

Circuit board E: fabricated in the same manner as in the circuit board D except for using the buildup layer forming material 1 for the buildup layer of the circuit board D.

Circuit board F: fabricated in the same manner as in the circuit board D except for using ABF-GX13 manufactured by Ajinomoto Co., Inc. (with no glass fiber substrate) for the buildup layer of the circuit board D.

Circuit board G: fabricated in the same manner as in the circuit board D except for using the buildup layer forming material 2 for the buildup layer of the circuit board D.

Circuit board H: fabricated in the same manner as in the circuit board D except for using the buildup layer forming material 3 for the buildup layer of the circuit board D.

Circuit board I: fabricated in the same manner as in the circuit board D except for using the buildup layer forming material 4 for the buildup layer of the circuit board D.

Circuit board J: fabricated in the same manner as in the circuit board D except for using the buildup layer forming material 5 for the buildup layer of the circuit board D.

Circuit board K: fabricated in the same manner as in the circuit board E except for using the core forming material 1 for the core layer of the circuit board E.

Circuit board L: fabricated in the same manner as in the circuit board D except for using APL3651 (with a glass fiber substrate) for the upper and lower outermost layers (two layers) and APL3601 (with no glass fiber substrate) for the inner four layers of the circuit board D.

Circuit board M: fabricated in the same manner as in the circuit board L except for using the buildup layer forming material 1 (with a glass fiber substrate) for the upper and lower outermost layers (two layers) of the buildup layer of the circuit board L.

Circuit board N: fabricated in the same manner as in the circuit board L except for using the buildup layer forming material 2 (with a glass fiber substrate) for the upper and lower outermost layers (two layers) of the buildup layer of the circuit board L.

Circuit board O: fabricated in the same manner as in the circuit board L except for using the buildup layer forming material 3 (with a glass fiber substrate) for the upper and lower outermost layers (two layers) of the buildup layer of the circuit board L.

Circuit board P: fabricated in the same manner as in the circuit board L except for using the buildup layer forming material 4 (with a glass fiber substrate) for the upper and lower outermost layers (two layers) of the buildup layer of the circuit board L.

Circuit board Q: fabricated in the same manner as in the circuit board L except for using the buildup layer forming material 5 (with a glass fiber substrate) for the upper and lower outermost layers (two layers) of the buildup layer of the circuit board L.

Circuit board R: fabricated in the same manner as in the circuit board K except for using APL3601 (with no glass fiber substrate) for the inner four layers of the buildup layer of the circuit board K.

Comparative Examples 1 to 7 and Examples 1 to 15

Conditions: Samples were pretreated at 30° C. and 60% for 168 hours. After the anti-reflow test (peak temperature: 260° C., conducted three times) and the heat cycle test (−55° C. (30 minutes)/125° C. (30 minutes), 500 cycles), peeling was observed using a scanning acoustic tomography apparatus. The number of faulty semiconductor packages in which peeling occurred in the total number of the samples is shown by "faulty number/total number of samples". The results of evaluation are shown in Tables 5 and 6.

In Examples 9 to 15 in which buildup layers containing a glass fiber substrate were used in two of the buildup layers in the circuit boards, all samples showed good anti-reflow properties and good heat cycle test results.

TABLE 5

|  | Type of core | Core thickness | Sealing resin composition | Build-up layer | Anti-reflow test | Heat cycle test After 500 cycles |
| --- | --- | --- | --- | --- | --- | --- |
| Comparative Example 1 | 679FG | 0.2 mmt | a | ABF-GX13 | 4/4 | 4/4 |
| Comparative Example 2 | HL832-HS | 0.2 mmt | a | ABF-GX13 | 4/4 | 4/4 |
| Comparative Example 3 | ELC 4785GS | 0.2 mmt | a | APL3601 | 2/2 | 2/2 |
| Example 1 | ELC 4785GS | 0.2 mmt | a | APL3651 | 0/3 | 0/3 |
| Example 2 | ELC 4785GS | 0.2 mmt | b | APL3651 | 0/3 | 0/3 |

TABLE 6

|  | Type of core | Core thickness | Sealing resin composition | Build-up layer | Anti-reflow test | Heat cycle test After 500 cycles |
| --- | --- | --- | --- | --- | --- | --- |
| Comparative Example 4 | ELC 4785GS | 0.2 mmt | d | 1 | 4/4 | 4/4 |
| Comparative Example 5 | ELC 4785GS | 0.2 mmt | c | ABF-GX13 | 4/4 | 4/4 |
| Comparative Example 6 | ELC 4785GS | 0.2 mmt | d | ABF-GX13 | 4/4 | 4/4 |
| Comparative Example 7 | ELC 4785GS | 0.2 mmt | d | 1 | 4/4 | 4/4 |
| Example 3 | ELC 4785GS | 0.2 mmt | a | 1 | 0/3 | 0/3 |
| Example 4 | ELC 4785GS | 0.2 mmt | a | 2 | 0/3 | 0/3 |
| Example 5 | ELC 4785GS | 0.2 mmt | a | 3 | 0/3 | 0/3 |
| Example 6 | ELC 4785GS | 0.2 mmt | a | 4 | 0/3 | 0/3 |
| Example 7 | ELC 4785GS | 0.2 mmt | a | 5 | 0/3 | 0/3 |
| Example 8 | 1 | 0.1 mmt | a | 1 | 0/3 | 0/3 |
| Example 9 | ELC 4785GS | 0.2 mmt | a | Two outermost layers: APL3651 Four inner layers: APL3601 | 0/3 | 0/3 |
| Example 10 | ELC 4785GS | 0.2 mmt | a | Two outermost layers: 1 Four inner layers: APL3601 | 0/3 | 0/3 |

TABLE 6-continued

| | Type of core | Core thickness | Sealing resin composition | Build-up layer | Anti-reflow test | Heat cycle test After 500 cycles |
|---|---|---|---|---|---|---|
| Example 11 | ELC 4785GS | 0.2 mmt | a | Two outermost layers: 2 Four inner layers: APL3601 | 0/3 | 0/3 |
| Example 12 | ELC 4785GS | 0.2 mmt | a | Two outermost layers: 3 Four inner layers: APL3601 | 0/3 | 0/3 |
| Example 13 | ELC 4785GS | 0.2 mmt | a | Two outermost layers: 4 Four inner layers: APL3601 | 0/3 | 0/3 |
| Example 14 | ELC 4785GS | 0.2 mmt | a | Two outermost layers: 5 Four inner layers: APL3601 | 0/3 | 0/3 |
| Example 15 | 1 | 0.1 mmt | a | Two outermost layers: 1 Four inner layers: APL3601 | 0/3 | 0/3 |

The above experimental results show that flip-chip semiconductor packages having high reliability without generating cracks can be obtained by realizing a stress reduction structure between the components by optimizing the properties of the cured products of buildup layers and sealing resin compositions.

EXPLANATION OF SYMBOLS

1 Circuit board
2 Semiconductor chip
3 Solder ball
4 Sealing resin composition cured member
4b Fillet part of sealing resin composition
5 Fiber substrate
6 Resin material layer
7 Build-up layer forming material containing fiber glass

INDUSTRIAL APPLICABILITY

A highly reliable semiconductor package which can positively suppress or reduce cracks and peeling can be produced according to the present invention.

The invention claimed is:

1. A flip-chip semiconductor package comprising a circuit board having a core layer and at least one buildup layer, a semiconductor chip connected to the circuit board through a metal bump, and a cured member that is made of a sealing resin composition and enclosed between the semiconductor chip and the circuit board, the cured member having a coefficient of linear expansion at 25 to 75° C. of 15 to 35 ppm/° C., and the at least one buildup layer having a glass transition temperature of 170° C. or more and a coefficient of linear expansion at 25 to 75° C. in the planar direction of 25 ppm/° C. or less.

2. The flip-chip semiconductor package according to claim 1, wherein the at least one buildup layer contains a fiber substrate.

3. The flip-chip semiconductor package according to claim 2, wherein the at least one buildup layer containing the fiber substrate is an outermost buildup layer.

4. The flip-chip semiconductor package according to claim 2, wherein the fiber substrate has a thickness of 5 to 35 μm.

5. The flip-chip semiconductor package according to claim 1, wherein the cured member has a glass transition temperature of 60 to 130° C.

6. The flip-chip semiconductor package according to claim 1, wherein the sealing resin composition further contains at least one epoxy resin, a curing agent, a silane coupling agent, and an inorganic filler.

7. The flip-chip semiconductor package according to claim 1, wherein the sealing resin composition has a viscosity of 50 Pa·sec or less at 25° C.

8. The flip-chip semiconductor package according to claim 1, wherein the core layer has a glass transition temperature of 160 to 270° C. and a coefficient of linear expansion at 25 to 75° C. in the planar direction of 10 to 20 ppm/° C.

9. The flip-chip semiconductor package according to claim 1, wherein the core layer has a thickness of 500 μm or less.

10. The flip-chip semiconductor package according to claim 1, wherein the core layer is formed from a fiber substrate and a resin composition containing at least one of an epoxy resin, a phenol resin, a cyanate resin, a triazine resin, a bismaleimide resin, a polyimide resin, a polyamideimide resin, and a benzocyclobutene resin.

11. The flip-chip semiconductor package according to claim 1, wherein the at least one buildup layer is formed from a resin composition containing at least one of an epoxy resin, a phenol resin, a cyanate resin, a triazine resin, a bismaleimide resin, a polyimide resin, a polyamideimide resin, and a benzocyclobutene resin.

* * * * *